US011881376B2

(12) United States Patent
Tang et al.

(10) Patent No.: US 11,881,376 B2
(45) Date of Patent: Jan. 23, 2024

(54) METHOD AND SYSTEMS USEFUL FOR PRODUCING ALUMINUM IONS

(71) Applicant: Entegris, Inc., Billerica, MA (US)

(72) Inventors: Ying Tang, Brookfield, CT (US); Joe R. Despres, Middletown, CT (US); Joseph D. Sweeney, New Milford, CT (US); Oleg Byl, Southbury, CT (US); Barry Lewis Chambers, Hot Springs Village, AR (US)

(73) Assignee: ENTEGRIS, INC., Billerica, MA (US)

( * ) Notice: Subject to any disclaimer, the term of this patent is extended or adjusted under 35 U.S.C. 154(b) by 104 days.

(21) Appl. No.: 17/492,089

(22) Filed: Oct. 1, 2021

(65) Prior Publication Data

US 2022/0108863 A1 Apr. 7, 2022

Related U.S. Application Data

(60) Provisional application No. 63/086,799, filed on Oct. 2, 2020.

(51) Int. Cl.
*H01J 37/08* (2006.01)
*H01J 37/32* (2006.01)
*H01J 37/317* (2006.01)

(52) U.S. Cl.
CPC ........ *H01J 37/08* (2013.01); *H01J 37/32532* (2013.01); *H01J 37/3171* (2013.01); *H01J 2237/31701* (2013.01)

(58) Field of Classification Search
CPC .... H01J 37/08; H01J 37/3171; H01J 2237/08; H01J 2237/006; H01J 2237/022; H01J 2237/0213
See application file for complete search history.

(56) References Cited

U.S. PATENT DOCUMENTS

| | | | |
|---|---|---|---|
| 2010/0051825 A1† | 3/2010 | Yamashita | |
| 2012/0252195 A1 | 10/2012 | Jones | |
| 2013/0140473 A1* | 6/2013 | Colvin | H01J 37/3171 250/492.3 |
| 2018/0346342 A1* | 12/2018 | Colvin | H01L 21/306 |
| 2019/0348252 A1* | 11/2019 | Colvin | H01J 37/3171 |
| 2020/0194265 A1 | 6/2020 | Tang | |

FOREIGN PATENT DOCUMENTS

| | | |
|---|---|---|
| KR | 20170134767 A | 12/2017 |
| WO | 2017223130 A1 | 12/2017 |

OTHER PUBLICATIONS

Exemplary Ion Source for the Implanting of Halogen and Oxygen Based Dopant Gases by Tseh-Jen Hsieh and Neil K. Colvin; pp. 140-143, 978-1-5090-2024-9/16/$31.00; 2016 IEEE.†

* cited by examiner
† cited by third party

*Primary Examiner* — David E Smith
*Assistant Examiner* — Hsien C Tsai

(57) ABSTRACT

Described are ion implantation devices, systems, and methods, and in particular to an ion source that is useful for generating an aluminum ion beam.

17 Claims, 20 Drawing Sheets

METHOD AND SYSTEMS USEFUL FOR PRODUCING ALUMINUM IONS

FIELD OF THE INVENTION

The invention relates generally to ion implantation devices, systems, and methods, and in particular to an ion source that is useful for generating an aluminum ion beam.

BACKGROUND

Implantation of aluminum ions into a substrate such as semiconductor material is used in semiconductor and microelectronic device fabrication. As a single example, aluminum has been used as a p-type dopant to dope part of the transistor structures of microelectronic devices. For instance, aluminum may be implanted into silicon or silicon carbide.

Ion implantation as practiced in semiconductor manufacturing involves doping of a chemical species into a substrate, such as a microelectronic device wafer, by impingement of energetic ions of such species on the substrate. To generate the ionic dopant species, a source of the dopant, which may for example be in the form of a halide or hydride of the dopant species, is subjected to ionization. This ionization is carried out using an ion source (a.k.a., "ion source apparatus") to generate an ion beam that contains the dopant species. The ion source generates ions within an "ion chamber" or "arc chamber".

Past methods of generating aluminum ions by an ion source have generated aluminum ions by combining aluminum dopant source in an arc chamber with a fluorinated compound, i.e., a "co-gas" (also sometimes referred to as a "carrier gas" or "co-reactant") that is boron trifluoride ($BF_3$), phosphorus trifluoride ($PF_3$). The aluminum is introduced to the ionization process as a solid aluminum-containing target material. The fluorinated compound reacts with (including chemical reaction and by physical sputtering) the solid aluminum and releases aluminum from the aluminum target into the arc chamber, where the aluminum is ionized.

Also present in the arc chamber are other solid materials such as tungsten or molybdenum, as structures of the arc chamber. During ionization, the fluorine-containing co-gas becomes ionized or degraded within the arc chamber to produce a neutral or ionized fluorine-containing species. These fluorine-containing species react with solid materials of the arc chamber other than the solid aluminum target, including the tungsten. The result is the generation of ionic species other than the desired aluminum ion, such as ionic tungsten (We) or tungsten-fluoride compounds ($WF_x^+$) or ionic molybdenum ($Mo^+$) or molybdenum-fluoride compounds ($MoF_x^+$). Within the arc chamber, over a period of use of the arc chamber, these undesired non-aluminum ionic species can build up as residue within the arc chamber. The residue may become deposited on operational components such as a cathode, anti-cathode, insulators or other structures. The deposited materials can cause a detrimental effect on the performance of the ion source, such as a reduced beam current over time or a reduced source life.

Micro arcing, sometimes called "Glitching" becomes more prevalent as insulators in the extraction electrode or other source area parts get deposited with the $WF_x^+$ or $MoF_x^+$ residue. The micro arcing can create non-uniformity in the beam impinging on the substrate impacting device yield.

Erosions of the refractory metal used for the arc chamber from the fluorine reactions ($WF_x^+$ or $MoF_x^+$) has a detrimental result on the arc chamber exits aperture. The arc chamber exit aperture creates the initial ion beam shape as the ion beam travels through the equipment to the target substrate. The ion beam shape can be distorted by the erosion of the aperture due to tungsten or molybdenum transport within the arc chamber. The erosion changes the shape of the exit aperture to a point that the equipment cannot compensate for a proper beam shape and or uniformity. This non uniform beam shape can create non uniform doping in the substrate and impact device yield.

SUMMARY

In one aspect, the invention relates to a method of generating aluminum ions in an ion source having an ion source chamber. The method includes: in an ion source chamber that contains aluminum ion source (or "aluminum dopant source"), flowing into the ion source chamber: fluorine-containing gas selected from $BF_3$, $PF_3$, $PF_5$, $GeF_4$, $XeF_2$, $CF_4B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_2n$, $C_nF_{2n-2}$, $C_nH_xF_{2n+2-x}$, $C_nH_xF_{2n-x}$, $C_nH_xF_{2n-2-x}$ (n=1, 2, 3 . . . , x=0, 1, 2 . . . ), $COF_2$, $SF_6$, $SF_4$, $SeF_6$, $NF_3$, $N_2F_4$, HF, $F_2$, or a combination thereof, and hydrogen-containing gas; and generating aluminum ions within the ion source chamber.

In another aspect, the invention relates to a method of forming aluminum ion in an ion source chamber. The method comprises flowing $PF_5$ into an ion source chamber that contains aluminum source, and generating aluminum ion within the ion source chamber.

In another aspect, the invention relates to an ion source apparatus capable of generating an ion mixture that contains aluminum ions. The apparatus includes: an ion source chamber comprising an interior and an interior structure that comprises aluminum target; a source of fluorine-containing gas in fluid communication with the interior, the fluorine-containing gas selected from $BF_3$, $PF_3$, $PF_5$, $GeF_4$, $XeF_2$, $CF_4B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_2n$, $C_nF_{2n-2}$, $C_nH_xF_{2n+2-x}$, $C_nH_xF_{2n-x}$, $C_nH_xF_{2n-2-x}$ (n=1, 2, 3 . . . , x=0, 1, 2 . . . ), $COF_2$, $SF_6$, $SF_4$, $SeF_6$, $NF_3$, $N_2F_4$, HF, $F_2$, or a combination thereof; and a source of hydrogen-containing gas in fluid communication with the interior.

In yet another aspect, the invention relates to an ion source apparatus capable of generating an ion mixture that contains aluminum ions. The apparatus includes: an ion source chamber comprising an interior and an interior structure that comprises aluminum target; and a source of $PF_5$ in fluid communication with the interior.

DETAILED DESCRIPTION

Figures 1, 2A:
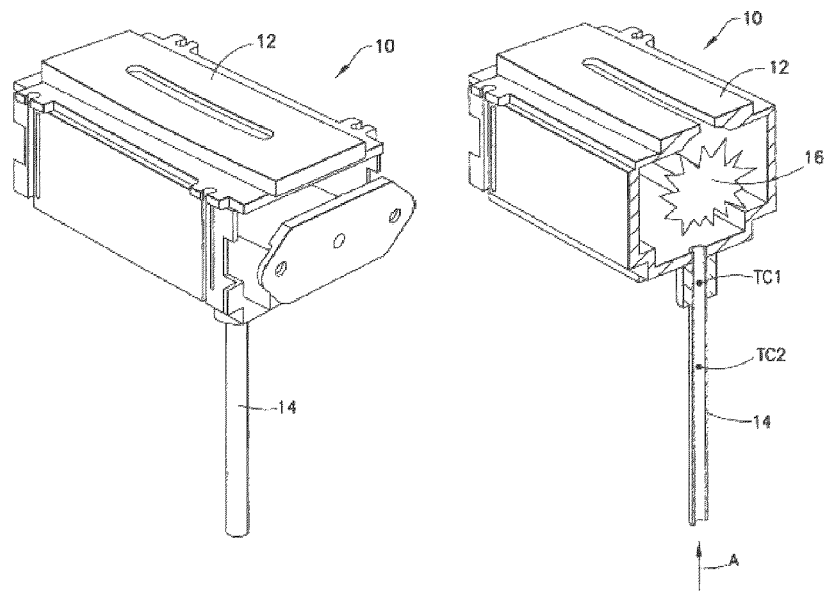
FIG. 1 is a schematic representation of an ion source as described.
FIG. 2A is a cross section of the ion source of FIG. 1.

The present disclosure relates to ion implantation methods, and in various aspects to apparatus, systems, equipment, and methods by which aluminum ions are generated in an ion source chamber and ion implantation system.

According to example methods, aluminum ions are generated by an ion source from aluminum dopant source, with a flow of fluorine-containing co-gas to the ion source (into an "ion source chamber" or "arc chamber" of the ion source) during generation of the aluminum ions. In some example methods, aluminum ions are generated using the aluminum dopant source in combination with a flow of both a fluorine-containing co-gas and a hydrogen-containing co-gas to the ion source. In still other example methods an inert gas (e.g., N$_2$, He, Ar, Kr, Ne, or Xe) may be flowed to the ion source along with the fluorine-containing gas, the hydrogen-containing co-gas, or the combination of fluorine-containing gas and hydrogen-containing co-gas.

The ion source contains a source of aluminum for ionization, sometimes referred to as an "aluminum dopant source" or "aluminum ion source." The aluminum dopant source may be any aluminum-containing solid or gaseous material that can be made to be present in an ion source chamber for ionization. An aluminum dopant source may be an aluminum-containing gas that is flowed into the ion source chamber from an external source. Alternately, the aluminum dopant source may be a solid aluminum target material that is contained as a solid at an interior of the ion source chamber, such as at a sidewall, e.g., as part of a replaceable liner structure, or as another solid structure. In some configurations a solid aluminum target may be biased to a voltage to help sputtering of aluminum from the solid aluminum target.

Examples of solid aluminum target materials include aluminum oxide, aluminum nitride, aluminum carbide, aluminum boride, as well as combination of any two or more of these. Optionally, a solid aluminum target may comprise isotopically enriched aluminum, i.e., an aluminum target may contain one or more aluminum isotopes above a natural abundance of such isotope.

During an ionization process, fluorine-containing gas is flowed into the ion source chamber. A fluorine-containing gas can react with the aluminum dopant source, or cause sputtering of the aluminum dopant source e.g., solid aluminum target, to produce a useful or desired amount of aluminum source for ionization to aluminum ions. Fluorine of the fluorine-containing gas is ionized by electrons generated in the ion source chamber. Fluorine or fluorine ions react with aluminum of the solid aluminum target to release aluminum or aluminum ion into the chamber. The aluminum or aluminum ions are ionized or further ionized to 2Al$^+$ Al$^+$, Al$^{++}$, Al$^{+++}$.

According to example methods of the present description, the Applicant has identified various fluorine-containing compounds that can be useful or advantageous when used as a fluorine-containing gas for producing aluminum ions from aluminum dopant source, especially from a solid aluminum target such as aluminum oxide, aluminum nitride, aluminum carbide, aluminum boride, or a combination of any two or more of these, and optionally in the presence of a hydrogen-containing gas. Example fluorine-containing gases include: BF$_3$, PF$_3$, PF$_5$, GeF$_4$, XeF$_2$, CF$_3$, CF$_4$, B$_2$F$_4$, SiF$_4$, Si$_2$F$_6$, AsF$_3$, AsF$_5$, XeF$_4$, XeF$_6$, WF$_6$, MoF$_6$, C$_n$F$_{2n+2}$, C$_n$F$_2$n, C$_n$F$_{2n-2}$, C$_n$H$_x$F$_{2n+2-x}$, C$_n$H$_x$F$_{2n-x}$, C$_n$H$_x$F$_{2n-2-x}$ (n=1, 2, 3 . . . , x=0, 1, 2 . . . ), COF$_2$, SF$_6$, SF$_4$, SeF$_6$, NF$_3$, N$_2$F$_4$, HF, F$_2$, or a combination of any two or more of these.

In particular methods, aluminum ions are produced from an aluminum dopant source, e.g., solid aluminum target in an arc chamber, in the presence of fluorine-containing gas that comprises, consists or, or consists essentially of PF$_5$, GeF$_4$ either alone or with hydrogen-containing gas. The fluorine-containing gas that is flowed to the arc chamber can comprise, consist of, or consist essentially of PF$_5$, GeF$_4$, or combination thereof, meaning that of a total amount of fluorine-containing gas flowing into the arc chamber, at least 50, 60, 70, 80, 90, 95, 98, 99, or 99.5 percent (volume) is PF$_5$, GeF$_4$, or combination thereof. The fluorine-containing gas may optionally be flowed in combination with a hydrogen-containing gas.

Also according to certain example methods, aluminum ions can be prepared, using an ion source, from aluminum dopant source in the presence of a flow of a combination of fluorine-containing gas and hydrogen-containing gas. In example methods, a hydrogen-containing gas may comprise $H_2$, $PH_3$, $AsH_3$, $SiH_4$, $B_2H_6$, $CH_4$, $NH_3$, $GeH_4$, or a combination thereof. Possible advantages of methods as described, that include the use of fluorine-containing gas in combination with hydrogen-containing gas with an ion source, may include improved performance of an ion source in the form of a useful or improved beam current, improved source life, or a useful or advantageous combination or balance of beam current and source life.

Beam current refers to the power of a beam of aluminum ions produced and released from an ion source. A desired beam current can be one that is uniform and steady during use, and may preferably have a high power (in milliamps, mA), but may also be selected based on how beam current strength may affect source life.

Various types of ion sources have been developed, including inductively heated cathode ion sources, Freeman-type ion sources, Bernas-type ion sources, and various others. Regardless of the specific type of ion source, an ion source must be capable of continuous operation for extended periods of time without experiencing a need to shut down the ion source due to a failure or reduced performance level of the ion source.

Ion source life (or "source life") refers to an amount of time of operation (e.g., period of operation) of an ion source (e.g., an ion source apparatus used to generate ions for an ion implantation system) without the ion source being shut down due to failure or a reduced level of performance of the ion source that requires maintenance, repair, or replacement of the ion source. Shutting down an ion source refers to reducing or eliminating power to the ion source and terminating production of aluminum ions as a supply of ions to a different or larger apparatus or equipment such as an ion implantation system. The period of operation may be continuous, or may be interrupted if interruptions are not due to a failure (including reduced performance) of the ion source but are due to a different need for shutting down the ion source, such as a failure or shutting down of a different component of an ion implantation system that includes the ion source.

Ion source failure that results in an end of ion source life, i.e., that would require shutting down, terminating, operation of the ion source, may occur due to any one or more of various causes. These include accumulation of deposits on cathode surfaces in a manner that negatively affects thermionic emission of ions, resulting in lowered arc currents, reduced performance, and shortened lifetime of the ion source. Another cause may be deleterious etching or deposition and deterioration of ion source components caused by ionic materials flowed into or generated within the ion source chamber, e.g., ionic fluorine species. Yet another cause may be stripping or sputtering of cathode material that results in a loss of physical integrity of the cathode and consequent reduction of performance of the ion source. Yet another cause may be the coating of insulators in the source area such as the extraction suppression electrode due to fluoride residues creating micro arcing. The micro arcing can reduce equipment process throughput due to retuning of the ion source to eliminate the micro arcing and increase non uniformity of doping on the substrate which can negatively affect device yield. Yet another cause may be the accelerated wear of the arc chamber exit aperture due to ionic fluorine species. This may create an uneven exit aperture and negatively affect beam uniformity in shape or beam density. Non uniformity in beam shape or density can reduce device yield.

Source life or source lifetime may be measured in hours, days, or weeks during which an ion source is operated as part of a larger system, e.g., an ion implantation system. An end of a life of an ion source, meaning failure or reduced performance of the ion source that is sufficient to require shutting down the ion source, may be identified in various ways and may depend on the specific ion source apparatus (e.g., type, model, manufacturer) as well as a specific larger system that uses the ion source, such as an ion implantation system (e.g., type, model, manufacturer). An end of source life and a need to shut down an ion source may be identified as, e.g.: a major source failure such as an internal component failure; insulators of the ion source or insulators of a downstream suppression electrode becoming coated and sustaining micro-arcing (referred to as "glitching"). Micro-arcing creates process errors, and will result in a system operator or system software shutting down the ion source for maintenance (ion source replacement or repair).

According to certain preferred methods as described, the presence of hydrogen-containing gas (as a "co-gas") in an ion source chamber, in addition to the presence of fluorine-containing gas (also a "co-gas") can produce a useful or advantageous effect of improved source life of a an ion source, preferably with the method also providing a desirably useful strength of a beam of aluminum ions. Example methods of this description include using hydrogen-containing gas as a co-gas with fluorine-containing gas to extend a useful operating life of an ion source; hydrogen-containing gas is flowed into the ion source as a co-gas, and an operating life of the ion source will be extended relative to an operating life that would result from comparable operation of the ion source without the flow of hydrogen-containing gas to the ion source as a co-gas. The presence of hydrogen-containing gas as a co-gas with fluorine-containing gas may extend an operating life of an ion source by 10, 25, 50, 100, 200 or 400 percent. An improvement of an ion source life may be measured as an increase in a period of time of use (period of operation) of an ion source, meaning, as described herein, a period of operation of the ion source absent a need to shut down the ion source due to failure or reduced performance of the ion source, such as due to "glitching" or any other impairment or reduced performance that would require maintenance, repair, or replacement of the ion source.

The amounts of fluorine-containing gas and optional hydrogen-containing gas that are flowed into the ion source chamber can be selected to result in effective ionization of aluminum dopant source and generation of an effective aluminum ion beam, also with consideration given to source life of the ion source. Useful or preferred relative amounts of hydrogen-containing gas and fluorine-containing gas can be selected to provide one or more desired effects of a useful beam current, a useful source life, or a balance of a desired beam current and a desired source life. A range of relative amounts of hydrogen-containing gas to fluorine-containing gas may have balanced effects that include: a relatively higher beam strength with a decreased source life resulting from lower relative amounts of the hydrogen-containing gas, compared to a useful or increased source life and relatively lower beam strength resulting from a relatively higher amount of the hydrogen-containing gas.

In example methods, a useful range of a relative amount of hydrogen-containing gas to fluorine-containing gas may be in a range from 2 to 60 percent (by volume) hydrogen-containing gas per total amount hydrogen-containing gas and fluorine-containing gas. Within this range, specific relative amounts of hydrogen-containing gas per total hydrogen-containing gas and fluorine-containing gas may be selected based on desired performance, such as based on desired ion beam strength versus source life. In some examples, a lower relative amount of hydrogen-containing gas to fluorine-containing gas will produce a beam current that is at an upper end or portion of a range. See FIGS. 6, 9, and 14. But, with a lower relative amount of hydrogen-containing gas, source life may be lower than a source life that results from using a higher relative amount of the hydrogen-containing gas; i.e., an increased relative amount of hydrogen-containing gas improves source life. For a combination of higher source life with a lower (but acceptable) beam strength, an amount of hydrogen-containing gas may be in a range from 5 to 60 percent (volume) hydrogen-containing gas per total amount of hydrogen-containing gas and fluorine-containing gas, e.g., in a range from 10 to 50 percent (volume) hydrogen-containing gas per total amount of hydrogen-containing gas and fluorine-containing gas.

An amount of hydrogen-containing gas per total amount of hydrogen-containing gas and fluorine-containing gas also has been shown to affect an amount of undesired non-aluminum ions produced in an arc chamber during ion generation. In specific, in an arc chamber that contains tungsten at an interior surface of the arc chamber, a higher relative amount of hydrogen-containing gas per total amount of hydrogen-containing gas and fluorine-containing gas can desirably result in a lower amount of tungsten ion ($W^+$), tungsten fluoride ion ($WF_x^+$), or both, produced during generation of desired aluminum ions. See FIGS. 7, 8, 10, 11, 13, 13, 15, 16, 18, and 19. Experimental data show that a higher relative amount of hydrogen-containing gas can result in a useful or advantageous effect of reducing tungsten ion ($W^+$) or tungsten fluoride ion ($WF_x^+$), i.e., will result in relatively lower amounts of tungsten ion ($W^+$), or tungsten fluoride ion ($WF_x^+$) (x=1, 2, 3, 4, 5 or 6), or both, being produced during operation of the ion source. Reducing the amount of these non-aluminum ions during an ionization process may also affect (e.g., increase) source life of an ion source.

The use of hydrogen-containing gas as a co-gas in a method as described will have varied effects on a method of generating aluminum ions, using an ion source, based on the design of the ion source. Effects of the hydrogen-containing gas on beam current, makeup of beam spectrum, source life, etc., may differ based, for example, on: the structure of the arc chamber, the location the solid aluminum target, the composition of the solid aluminum target (AlN or $Al_2O_3$), the shape and form of the aluminum target, arc voltage, the presence and strength of a source magnet, the location and chemical makeup of a cathode and anti-cathode, among other features of ion source design and operation. Various suppliers (manufacturers) of ion source apparatus will have different designs with respect to these and other ion source features. Accordingly, the effect of the presence and amount of hydrogen-containing gas as a co-flow gas during a method of generating aluminum ions may vary based on the design (structure, makeup) of the ion source apparatus and operating parameters (e.g., arc voltage, source magnet strength).

As illustrated by the Examples infra, the presence of hydrogen-containing co-gas added to an ion source and fluorine-containing gas, when generating aluminum ions, can result varied performance features in terms of: beam current (total beam strength), beam spectrum (e.g., content of tungsten and other types of ions), and tungsten beam current (strength of current with respect to tungsten ions). Relative to each of these different performance features, a desired optimal or maximum performance level may be determined relative to a range of hydrogen-containing gas used. The location of a maximum performance level can depend on factors that include the design of the ion source apparatus, operating parameters, etc., as mentioned. Accordingly, a method of the present invention can include flowing hydrogen gas into an ion source in an amount that will provide a desired maximum or optimal performance with respect to: peak beam current (total beam strength), a desired beam spectrum (e.g., a low tungsten ion content), and tungsten beam current (beam strength of the tungsten component), each relative to a range of hydrogen-containing gas. A method may identify any one of these single factors and operate with a level of hydrogen-containing gas selected to provide a best performance for a single factor, or may operate with a level of hydrogen-containing gas that is selected to operate with a balanced effect on two or three of these factors.

As one example, a method can include flowing hydrogen-containing gas into an ion source in an amount that is at or near a level that produces a peak beam current (total). A beam current (total) will vary relative to an amount of hydrogen-containing gas flowed to an ion source. The beam current will exhibit a maximum current ("maximum beam current") at a location along the range. The maximum beam current may be at an amount (concentration, percent) of the hydrogen-containing gas that is zero, or at an amount (concentration, percent) of the hydrogen-containing gas that is greater than zero.

A method as described may include flowing hydrogen-containing gas to an ion source in an amount that is within 2, 5, 10, 20, 30, 40, 50 or 60 percentage points of a maximum beam current. If a maximum beam current is produced at 20 percent hydrogen, the method may include flowing hydrogen-containing gas in an amount of from 18 to 22 percent (which is within 2 percentage points of 20 percent), or in an amount of from 15 to 25 percent (which is within 5 percentage points of 20 percent), or in an amount of from 10 to 30 percent (which is within 10 percentage points of 20 percent). If the maximum beam current is at or near an amount of zero percent hydrogen-containing gas, example methods of the invention may include flowing hydrogen-containing gas into the ion source in an amount that is below 10, 5, or 2 percent.

The size of a range of useful amounts of hydrogen-containing gas (useful levels of flow as a percent) for a particular ion source and method may vary based on the nature of the response of beam current to an amount of hydrogen-containing gas inflow to an ion source. For a system that shows a relatively steady level of beam current over a range of hydrogen-containing gas inflow (see FIG. 21), a range of useful amounts of hydrogen-containing gas may be more broad and extend over a larger range of percentage points from a peak or maximum.

Other example methods of the present description may include flowing hydrogen-containing gas into an ion source in an amount that provides a desired balance between a high beam strength (total) and a low amount of tungsten ion in the beam. The amount of tungsten ion in an ion beam produced according to the present methods will vary relative to an amount of hydrogen-containing gas flowed to an ion source, and generally will decrease with an increased amount of the hydrogen-containing gas.

A method as described may include flowing hydrogen-containing gas to an ion source in an amount that provides a desirable reduction in tungsten ion ($W^+$) within an ion beam. Hydrogen-containing gas may reduce an amount of tungsten ion ($W^+$) in an ion beam by at least 5, 10, 20, 40, 50 or 60 percent, with increasing levels of hydrogen-containing gas, compared to an amount of tungsten ion in the ion beam produced in a comparable fashion but with a concentration of zero percent hydrogen-containing gas. An example of a method as described may include flowing hydrogen-containing gas into the ion source in an amount that will reduce an amount of tungsten ion ($W^+$) in an ion beam by at least 5, 10, 20, 40, 50 or 80 percent compared to an amount of tungsten ion that would be present in an ion beam produced using a concentration of zero percent hydrogen-containing gas flowed into the ion source. Example amounts of hydrogen-containing gas that can result in a reduction of tungsten ion ($W^+$), in an ion beam, of at least one of these amounts, may be at least 5, 10, 15, 20, 30, 40, 50 or 60 percent hydrogen-containing gas.

Related to a reduction in tungsten ion in an ion beam may be a reduction in beam glitches, e.g., as measured in terms of glitches per hour during operation of an ion source. A single "glitch" is a sudden unwanted degradation in beam quality during ion generation in an ion source, and may be caused by undesired arcing inside the arc chamber or at the suppression electrode. A method as described may include flowing hydrogen-containing gas into an ion source in an amount that provides a desirable reduction in glitching of the ion source during a process of generating aluminum ions, relative to an amount of glitching of a comparable process that does not flow any hydrogen-containing gas into the ion source.

Hydrogen-containing gas may reduce glitching of an ion source by at least 20, 50, 70, or 80 percent, with the reduction being a result of mixture or co-flowing hydrogen-containing gas, when compared to glitching that would occur when operating the ion source in a comparable fashion but with no hydrogen-containing gas flowed into the ion source. An example of a method as described may include flowing hydrogen-containing gas into the ion source in an amount that will reduce an amount of glitching of the ion source by at least 20, 50, 70, or 80 percent compared to an amount of glitching that would occur in the ion source with no flow of the hydrogen-containing gas. Example amounts of hydrogen-containing gas that can result in a desired reduction in glitching of an ion source may be at least 5, 10, 15, 20, 30, 40, 50 or 60 percent hydrogen-containing gas.

Referring now to the Figures, FIG. 1 is a representation of an ion source 10 as a component of an ion implantation system. Gas feed line 14 is configured to feed one or more co-gases to ion source 10 for use during an ionization process performed within an interior of the ion source, i.e., within an ion source chamber (or "arc chamber") 12 of ion source 10. Ion source 10 thus provides an ion source chamber 12 that contains an aluminum dopant source, e.g., a solid aluminum target that is susceptible to reaction with the fluorine-containing gas or a derivative thereof to cause release of aluminum ion into the arc chamber.

FIG. 2A is a cross section of ion source 10, showing the generation of a plasma 16 at an interior (ion source chamber 12) of ion source 10. One or more co-gas (e.g., fluorine-containing gas, hydrogen-containing gas, or both) are flowed in the direction indicated by arrow A through co-gas feed line 14. Ion source 10 contains at its interior an aluminum dopant source such as a solid aluminum target that is susceptible to reaction with the fluorine-containing gas for release of aluminum ion to the ion source chamber. An example aluminum dopant source may be a solid aluminum target in the form of a replaceable sidewall liner, an anti-cathode, or an extension or "fin" that is disposed at an interior position within the ion source chamber.

Also included as part of ion source 10 are other components adapted for operation of ion source 10 and ion source chamber 12. These include the sidewalls (including bottom, top, opposed sides, and opposed ends) a cathode, an anti-cathode, a source of voltage between the cathode and the anti-cathode, a magnet to cause movement of the electrons within the arc chamber interior, among other possible functional components. Sidewalls or removable liners may be made from tungsten, molybdenum, graphite, among other materials. A cathode and an anti-cathode may be made of any useful material, and each is typically made from tungsten. The ion source chamber is designed to restrict gas (an ion beam) from leaving the interior except through the exit aperture.

Figures 2B, 2C:
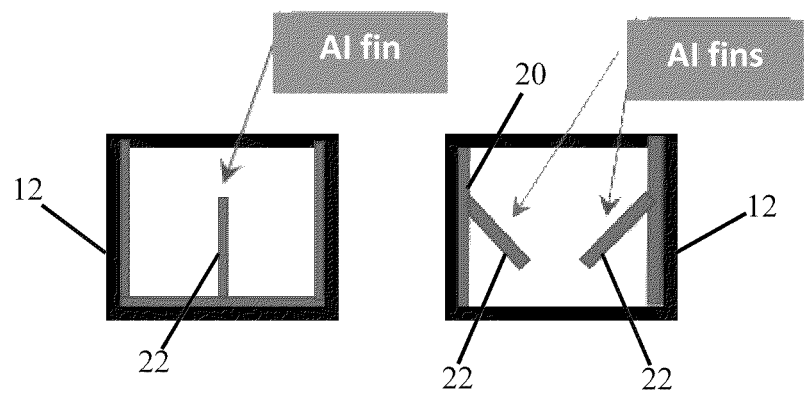
FIGS. 2B and 2C and 2D show example aluminum target structures of an ion source as described. Figure
Figure 2D:
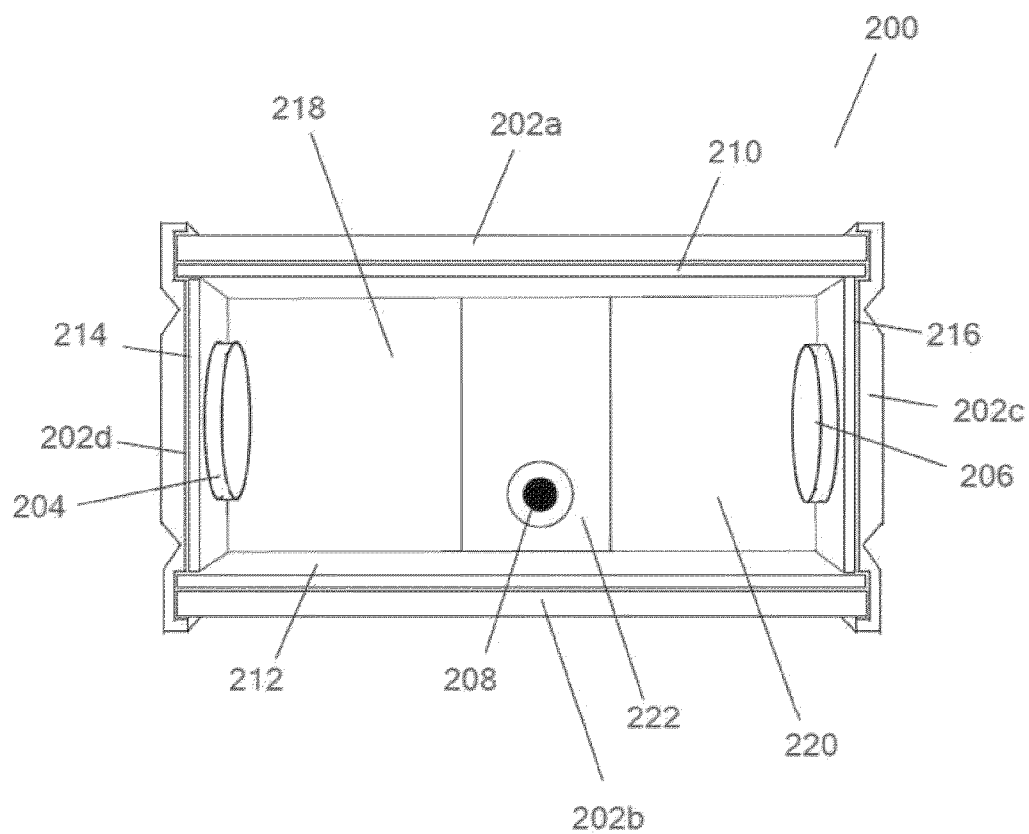

Particular examples of solid aluminum targets in the form of three-dimensional extensions or "fins" that extend into an interior space of an ion source chamber are shown at FIGS. 2B, 2C and 2D. FIGS. 2B, 2C and 2D show ion source chamber 12 that defines an interior. Interior surfaces of ion source chamber 12 include a top, bottom, and sidewalls and ends, which may be made of known materials such as tungsten, molybdenum, or aluminum target materials. FIGS. 2B and 2C are cross-sectional views of an example ion source chamber 12 viewed from a position of a cathode at one end of the ion source, looking through the ion source chamber in a direction of an anti-cathode at an opposite end. An ion beam that contains a mixture of ions generated within ion source chamber 18 exits though the top of ion source chamber 18.

FIG. 2B shows interior surfaces 20 in the form of example removable liners that can be removed and replaced, e.g., during maintenance of ion source chamber 12. At FIG. 2B, a removable liner that defines a bottom interior surface also includes an elongate aluminum target structure 22 that extends into the space defined as ion source chamber 18. Elongate aluminum target structure 22 has a three-dimensional form that includes a length, width, and height, and exhibits an aspect ratio of height (dimension extending away from the interior surface of ion source chamber 18) to width of at least 1:1, preferably at least 2:1, 5:1, 10:1, or at least 20:1. The height and width of elongate aluminum target structure 22 are shown in the cross-sectional view of FIGS. 2B and 2C; structure 22 also has a length (not shown) that extends along a length of ion source chamber 18 between the cathode and the anti-cathode.

Alternate examples of elongate aluminum target structures 22, which are optionally included part of a removable liner, are shown at FIG. 2C. The elongate aluminum target structures 22 of FIG. 2C are two, with one on each side of ion source chamber 12, as compared to the single structure at a bottom of ion source chamber 12 of FIG. 2B. The two elongate aluminum target structures 22 of FIG. 2C extend from the at opposed sidewalls of ion source chamber 12 as compared to extending from its bottom, at FIG. 2B, and are oriented at a non-perpendicular angle relative to the surface of the sidewalls.

FIG. 2D is a top-down view of an interior of another ion source chamber 200 that includes arc chamber walls 202a, 202b, 202c, and 202d. In the chamber at one end is cathode 204, and at the other end anti-cathode 206. The arc chamber walls are covered with arc chamber liners 210, 212, 214, and 216, on the side walls, and also arc chamber liners 218, 220, and 222 on the bottom side. On the bottom wall there is also a gas input opening 208. In embodiments, one, two, three, four, five, or six of arc chamber liners 210, 212, 214, 216, 218, 220 and/or 222 can be made from aluminum containing (aluminum target) materials. In embodiments, the arc chamber liners 218 or 220 can be made from aluminum containing (aluminum target) materials.

A solid aluminum target that includes an elongate structure that extends into the space of ion source chamber 18 will cause the solid aluminum target to be positioned more directly within a magnetic field of an ion source chamber. A magnetic field of an ion source chamber is adapted to confine electrons emitted from a cathode toward space at a center or middle portion of the chamber. An anti-cathode or repeller pushes back electrons that have passed though the magnetic field. The magnetic field also provides spin of the electrons emitted from the cathode to increase the likelihood of a collision with a gas atom or molecule contained in the chamber. Solid aluminum target that extended from an interior surface (bottom or sidewall) of the ion source chamber, to position a portion of the solid aluminum target at a more interior portion (e.g., a center portion) of the ion source chamber, places the target at a location of a stronger portion of the magnetic field. This positioning will position a portion of the solid aluminum target to be in more direct contact with plasma of the ion source.

Figure 3:
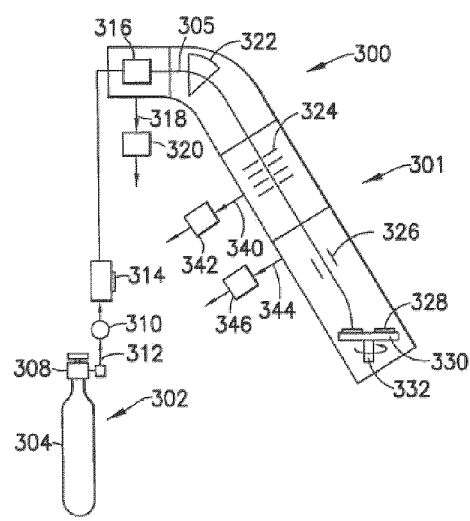
FIG. 3 is a schematic representation of an ion implant process system.

FIG. 3 is a representation of an ion implant process system 300 that includes ion source 316 and at least one (optionally two or more) storage and dispensing vessels 302 holding a co-gas or combination of co-gases as described. An example co-gas is a fluorine-containing gas supplied to ion source 316 for in situ reaction with a solid aluminum target located within ion source 316 to generate aluminum ion for ion implantation doping of substrate 328 in the illustrated ion implant chamber 301. While only a single dispensing vessel 302 is illustrated, a system 300 may include two or more such vessels to supply two or more different co-gases or co-gas mixtures to ion source 316.

The storage and dispensing vessel 302 comprises a vessel wall enclosing an interior volume holding a co-gas or mixture of co-gases. The vessel 302 may be a gas cylinder of conventional type, with an interior volume arranged to hold only gas, or alternatively, the vessel may contain a sorbent material having sorptive affinity for the reactant gas, and from which the co-gas is desorbable for discharge from the vessel under dispensing conditions. The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

One or a combination of co-flow gases (hydrogen-containing gas, fluorine-containing gas, or both) may be flowed from vessel 302 through conduits and related controls (not illustrated), e.g., pressure controls, temperature controls, mass flow controls, and the like. Multiple vessels 302 can be any useful storage vessels used to individually handle and separately store go-gases such as hydrogen-containing gas, fluorine-containing gas. For example, system 300 may contain two separate vessels 302, one vessel containing high-purity fluorine-containing gas as described, and a second vessel 302 containing high-purity hydrogen-containing gas as described. Still additional vessels 302 may also be present, e.g., for supplying an inert gas. According to other example systems and vessels, a vessel 302 may contain a mixture of fluorine-containing gas and hydrogen-containing gas in a single vessel; the two gases may be any as described herein and they two different gases may be contained in the vessel (with no other gases) in any relative amounts as described herein.

A vessel 302 may be any storage vessel that is useful for supplying on or more fluorine-containing or hydrogen-containing gas to system 300. Examples include non-adsorbent-type pressurized storage vessels, and sorbent-based storage vessels that may store a co-gas either at super-atmospheric or sub-atmospheric pressure for delivery at super-atmospheric or sub-atmospheric pressure. Examples of sorbent-based gas and non-sorbent-based storage and supply vessels include those commercially available from Entegris, Inc. (Billerica, Massachusetts, USA). Specific examples of sorbent-based products are available under the trademark SDS. Examples of pressure-regulated vessels that include an internal gas pressure regulator (alternately, a pressure regulator may be incorporated into a valve), are available from Entegris, Inc. (Billerica Massachusetts, USA) under the trademark VAC. A sorbent-based vessel may include any useful type of solid adsorbent material, such as a metal organic framework (MOF) adsorbent such as a zeolitic inorganic framework (ZIF), carbon-based adsorbents, among various others.

The ion implant chamber 301 contains ion source 316 to receive the dispensed one or more co-gases from line 312. A fluorine-containing gas can react with the solid aluminum target within the ion source chamber to generate aluminum ion that form ion beam 305, which contains aluminum ions. Ion beam 305 exits the ion source through the ion source exit aperture and passes through the extraction suppression electrode. Ion beam 305 passes through mass analyzer unit 322 which selects desired ions for implantation, i.e., aluminum ions, and rejects the non-selected ions.

The selected ions pass through acceleration electrode array 324 and then deflection electrodes 326. The resultingly focused ion beam is impinged on the substrate element 328 disposed on the rotatable holder 330 mounted in turn on spindle 332, to form a doped (aluminum-doped) substrate as the ion implantation product.

Sections of the ion implant chamber 301 are exhausted through lines 318, 340, and 344 by means of pumps 320, 342 and 346, respectively.

EXAMPLES

According to certain example methods of the invention, solid aluminum ion precursor, i.e., a solid aluminum target that contains aluminum nitride (AlN) or that contains alumina ($Al_2O_3$), can be used to generate aluminum ions in an ion source chamber (or "arc chamber") of an ion source, in combination with fluorine-containing gas, hydrogen-containing gas, or both. The solid aluminum target may be in the form of a replaceable liner or other solid structure to be contained within the ion source chamber. The generated aluminum ion beam exhibits a useful or advantageous strength, while also exhibiting a useful or relatively long source life, with the aluminum ion beam being continuous for a useful period of time.

The following examples show that different fluorine-containing gases may be useful, and that different combinations of fluorine-containing gases with hydrogen-containing gases may also be useful for producing a beam of aluminum ions using an ion source, according to methods and equipment described herein.

Figure 4:
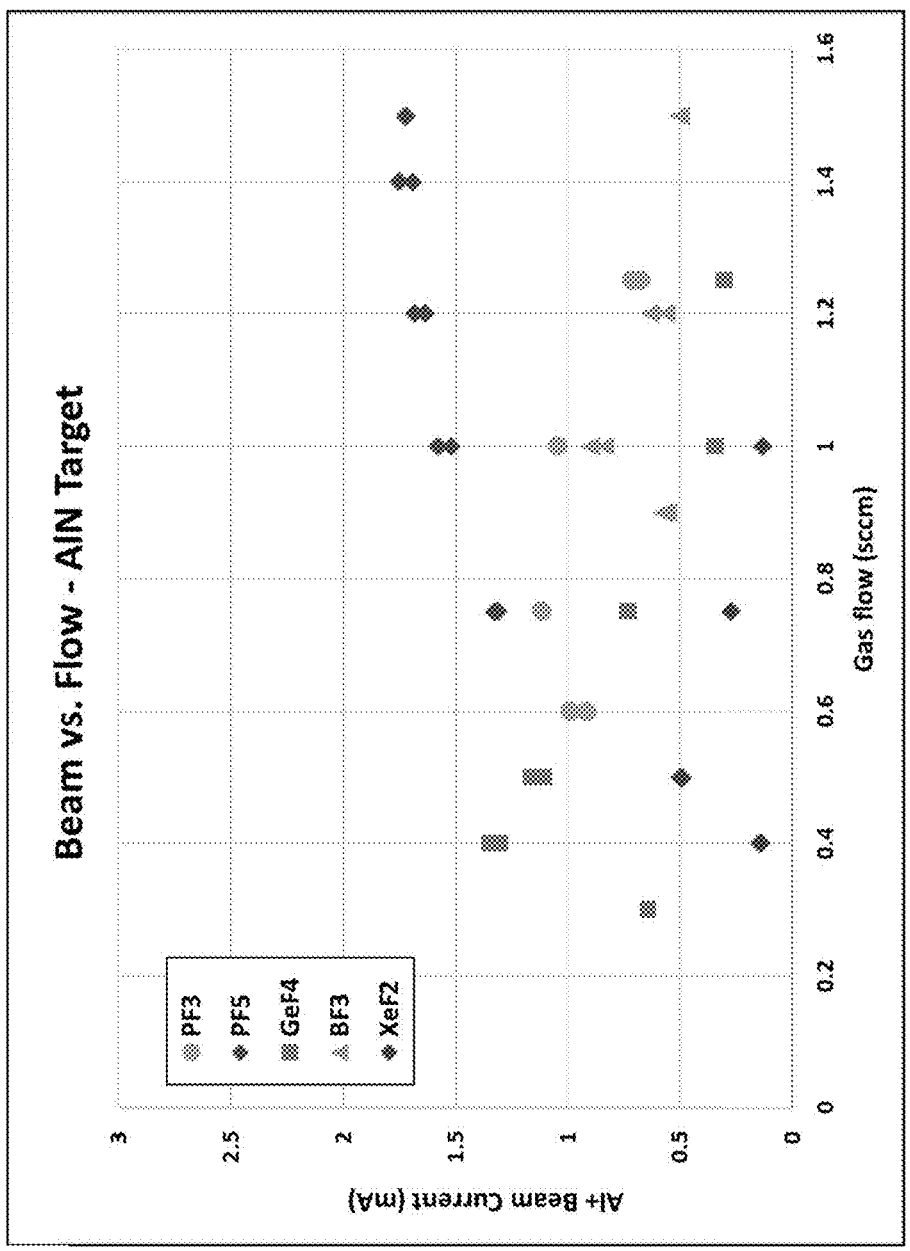
FIG. 4 shows beam performance achieved using various fluorine-containing gases with a solid aluminum nitride target.

Example 1. (FIG. 4) Aluminum Nitride Precursor with Various Fluorine-Containing Co-Gases and No Hydrogen-Containing Co-Gas FIG. 4 shows experimental examples of an $Al^+$ beam current achieved by using solid aluminum nitride as a solid aluminum target, with different (single) fluorine-containing co-gases, and without any amount of hydrogen-containing co-gas. The results demonstrate that a variety of different fluorine-containing gases can be used to generate a useful aluminum ion beam from an ion source.

The data of FIG. 4 show that each of $PF_3$, $PF_5$, $GeF_4$, $BF_3$, and $XeF_2$ is effective as a co-gas in an ion source for generating aluminum ions, using aluminum nitride as a solid aluminum target, over a range of flow rates of the co-gases. As a particular observation, $PF_5$, is effective as a co-gas and produces a beam current strength that is greater than the other fluorine-containing gases over a range of gas flow rates.

Figure 5:
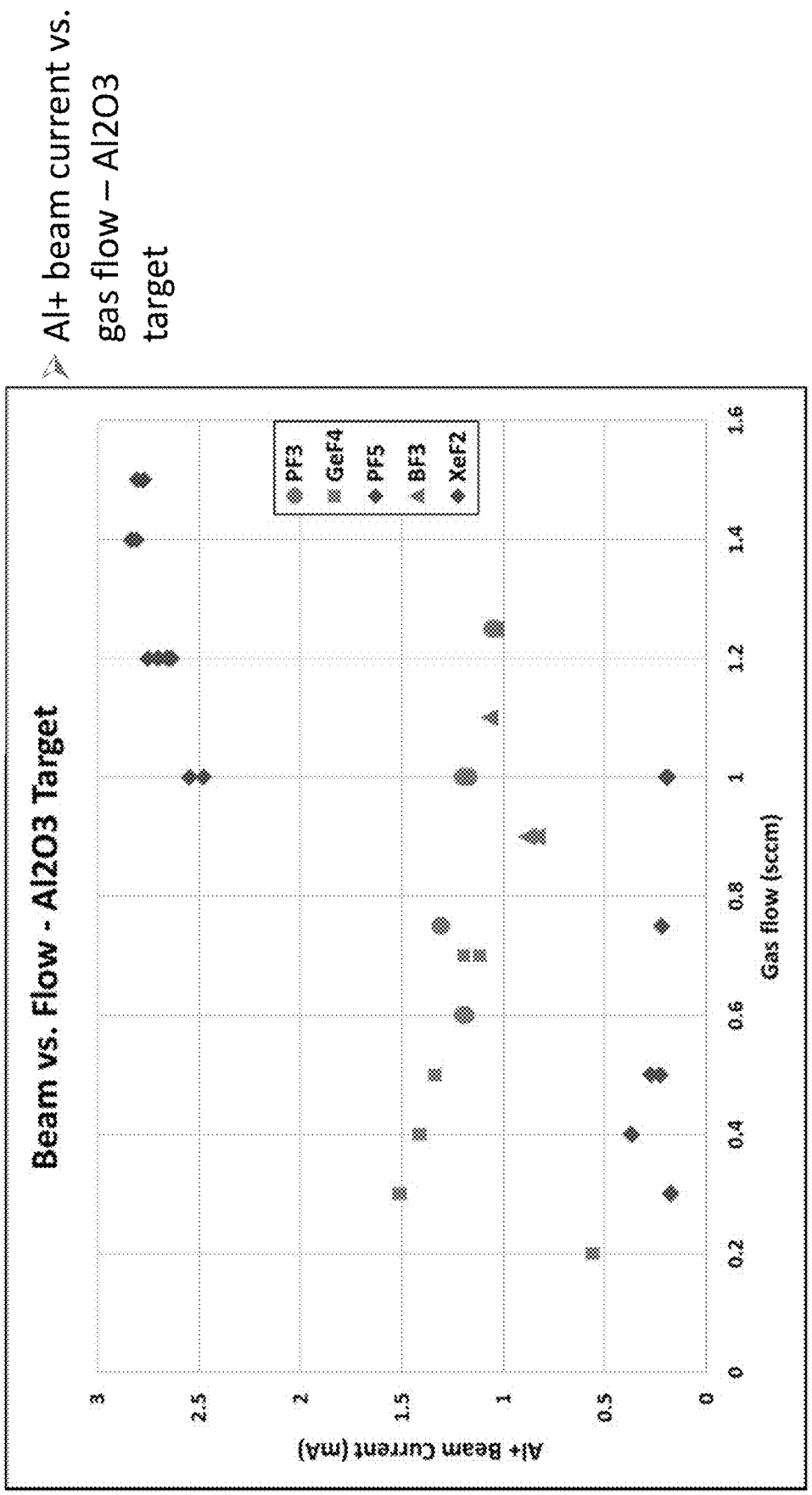
FIG. 5 shows beam performance achieved using various fluorine-containing gases with a solid aluminum oxide target.

Example 2. (FIG. 5) Aluminum Oxide Precursor with Various Fluorine-Containing Co-Gases and No Hydrogen-Containing Co-Gas FIG. 5 shows experimental examples of an Al+ beam current achieved by using solid aluminum oxide as a solid aluminum target, with different (single) fluorine-containing co-gases, and without any amount of hydrogen-containing co-gas. The results indicate that a variety of different fluorine-containing gases can be used (alone) to generate a useful aluminum ion beam from an ion source.

The data of FIG. 5 show that each of $PF_3$, $PF_5$, $GeF_4$, $BF_3$, and $XeF_2$ is effective as a co-gas in an ion source for generating aluminum ions, using aluminum nitride as a solid aluminum target, over a range of flow rates of the co-gases. The different fluorine-containing gases have different performance levels, producing beam currents of different strengths. As a particular observation, $PF_5$, produces a beam current strength that is greater than the other fluorine-containing gases over a range of gas flow rates.

Example 3. (FIGS. 6, 7, and 8) Aluminum Nitride Precursor with $PF_5$ Fluorine-Containing Co-Gas and Varied Amounts Hydrogen-Containing Co-Gas ($H_2$)

Figure 6:
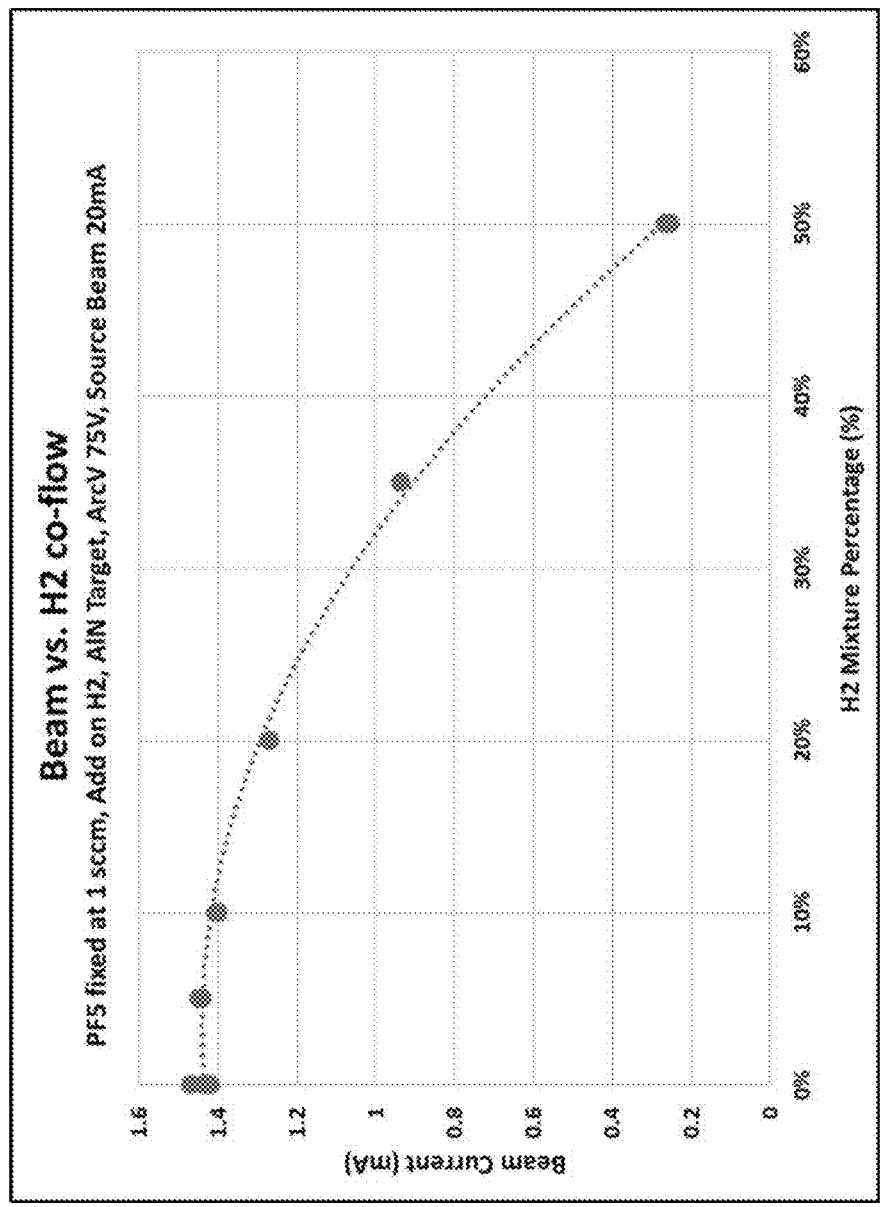
FIG. 6 shows beam current produced by an ion implantation system using an aluminum nitride target, $PF_5$ as a fluorine-containing gas, and H$_2$ as a hydrogen-containing gas over a range of relative amounts.

FIG. 6 shows experimental examples of an $Al^+$ beam current achieved by using solid aluminum nitride as a solid aluminum target, $PF_5$ fluorine-containing co-gas, and varied amounts of hydrogen ($H_2$) as hydrogen-containing co-gas. The data was generated by a process that flowed 1 standard cubic centimeter per minute (sccm) of $PF_5$ while varying flow of the hydrogen. Arc voltage (ArcV) was 75 volts and the power of the source beam was 20 milliamps (mA).

The results at FIG. 6 indicate that beam current will vary over a range of a relative amount of the hydrogen-containing gas versus total hydrogen-containing gas and fluorine-containing gas. Lower amounts of hydrogen provide a relatively higher beam current. However, using higher amounts of hydrogen results in reduced levels of certain non-aluminum ions (see FIGS. 7 and 8), which may extend source life. A maximum beam current occurs at approximately 5 percent hydrogen. To maximize total beam current strength, a method of the invention may be performed by flowing hydrogen to the ion source in an amount of about 5 percent. Alternately, to achieve a desirably high beam current strength balanced by a relatively higher ion source life or a relatively lower amount of tungsten ion in an ion beam, the method may be performed by flowing a different (higher) amount of hydrogen to the ion source, e.g., an amount in a range from 2 to 60 percent, or from 3 to 40 or 45 percent, or from 1 to 15 or 25 percent.

While the maximum beam current occurs at a hydrogen concentration of approximately 5 percent, a maximum beam current may be higher or lower for different ion source designs and for different operating parameters (e.g., arc voltage), with other factors being similar. A useful method for a different ion source or different operating parameters, may adjust the amount of hydrogen-containing gas based on the amount of hydrogen-containing gas that is found to produce the maximum beam current.

Figure 7:
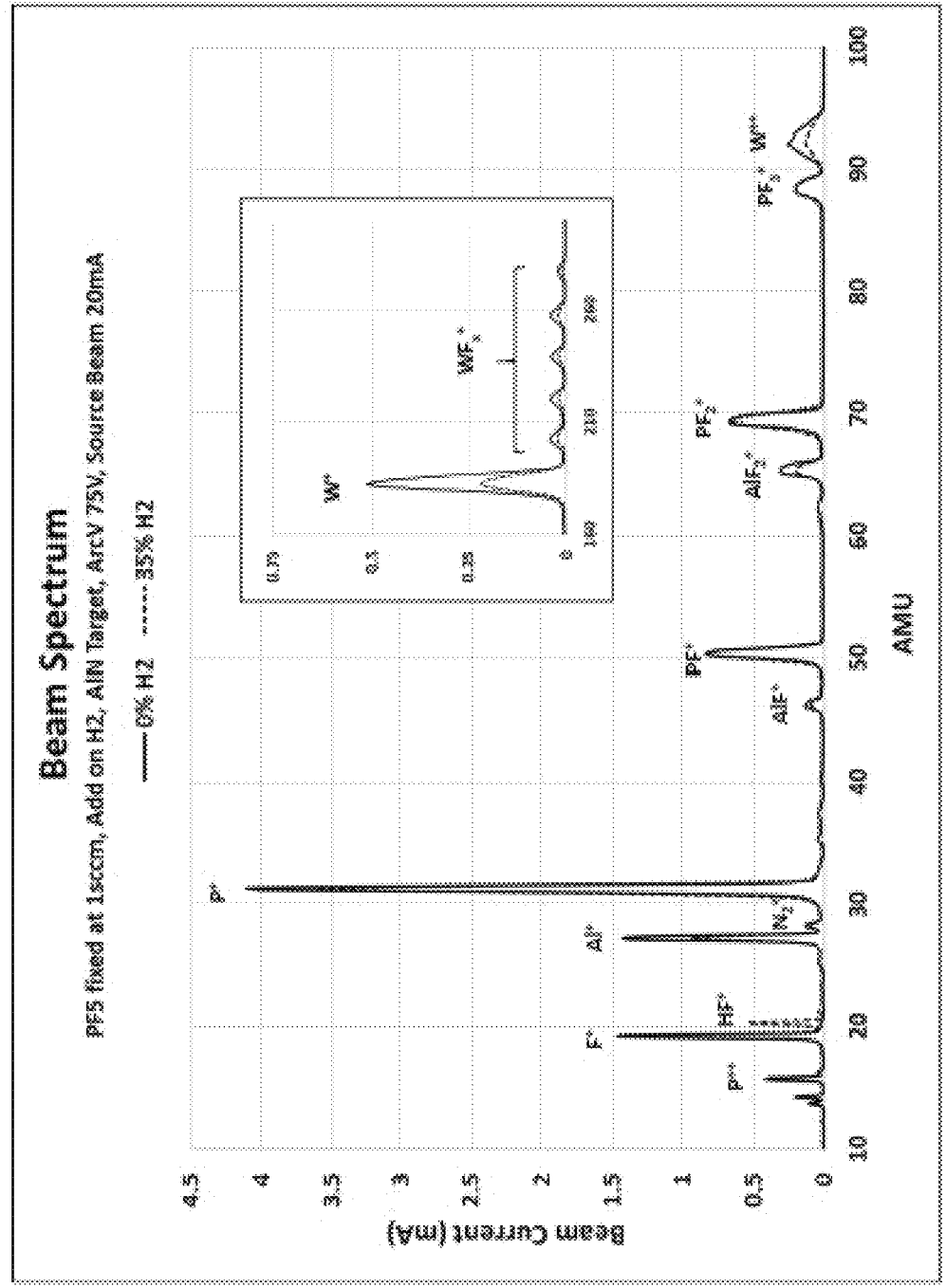
FIGS. 7 and 8 show ionic species and relative amounts thereof contained in ion beams produced by an ion implantation system using an aluminum nitride target, PF$_5$ as a fluorine-containing gas, and H$_2$ as a hydrogen-containing gas, and using varied amounts of the hydrogen-containing gas.

FIG. 7 shows beam current relative to atomic mass unit (AMU) of aluminum and non-aluminum ions produced in Example 3.

The results at FIG. 7 indicate that certain beam currents of non-aluminum ion species are reduced with higher relative amounts of hydrogen-containing co-gas. In specific, the beam contains significantly reduced amounts of $W^{++}$, $W^+$, and $WF_x^+$ ions, which are ions that can negatively affect ion source performance and source life, e.g., by causing "glitching," deposition, or by eroding an arc chamber exit aperture.

Figure 8:
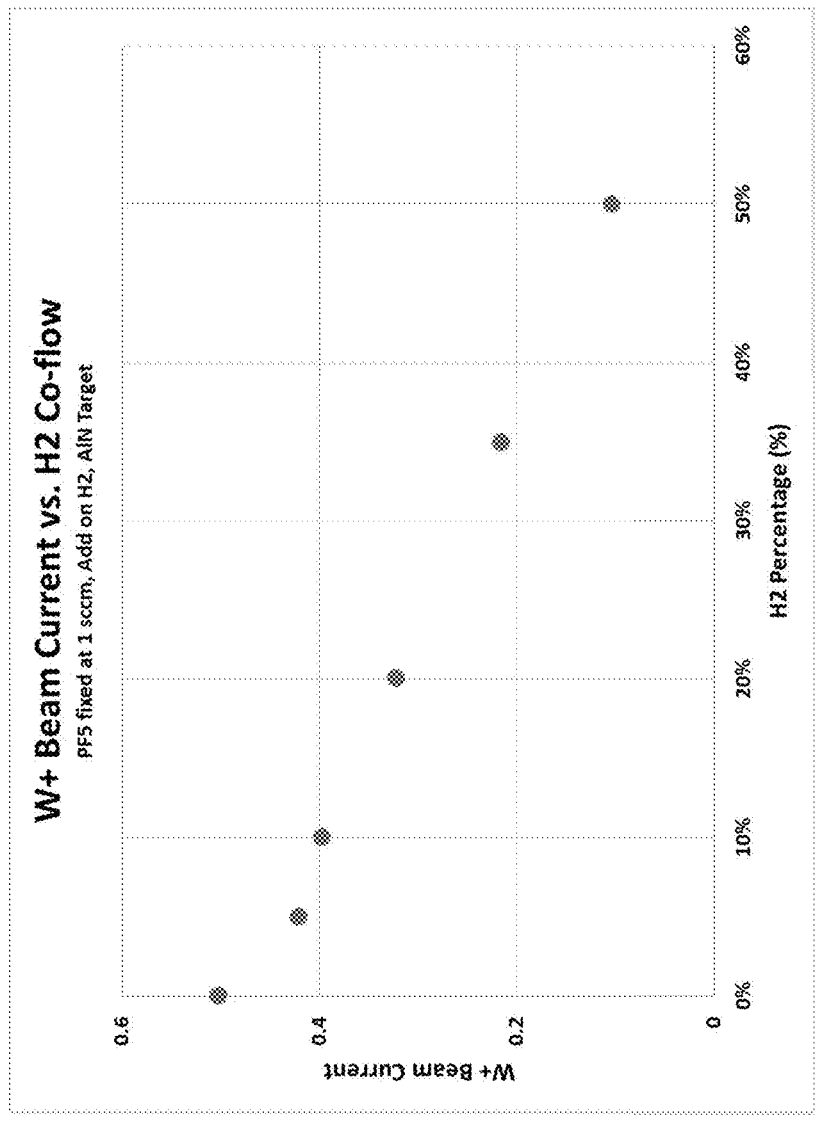

FIG. 8 shows beam current of tungsten ion ($W^+$) relative to different amounts of hydrogen (percentage), and indicates that higher levels of hydrogen result in steadily reduced levels of tungsten ion in the ion beam that is produced.

For the system and method of Example 3, a preferred range of hydrogen can be one that causes a desired reduction in tungsten ion ($W^+$) in an ion beam, which may be an amount of hydrogen that is at least 5, 10, 20, 30, 40, 50 or 60 percent as shown at FIGS. 7 and 8. Optionally, a specific amount of hydrogen that is used may be balanced with a desired (e.g., optimized) beam current strength as shown at FIG. 6. Example methods to balance a desirably high total beam current (FIG. 6) with a desirably low tungsten ion beam current (FIG. 7, FIG. 8) may be performed by flowing hydrogen (or another hydrogen-containing gas) in an amount in a range from 2 to 60 percent, or from 5 or 10 percent up to 20, 25, 30, 35, 40, 45, 50 or 55 percent.

Within these ranges, the system may perform with a reduced level of beam instability or glitching produced by a useful level of the hydrogen gas. According to a method of the invention, the amount of hydrogen used may be selected to produce a reduced level of glitching, e.g., a level of glitching that is reduced by at least 5, 10, 20, 50, 70, or 80 percent relative to an amount of glitching that occurs with no hydrogen.

Example 4. (FIGS. 9, 10, and 11) Aluminum Oxide Precursor with $PF_5$ Fluorine-Containing Co-Gas and Varied Amounts Hydrogen-Containing Co-Gas ($H_2$)

Figure 9:
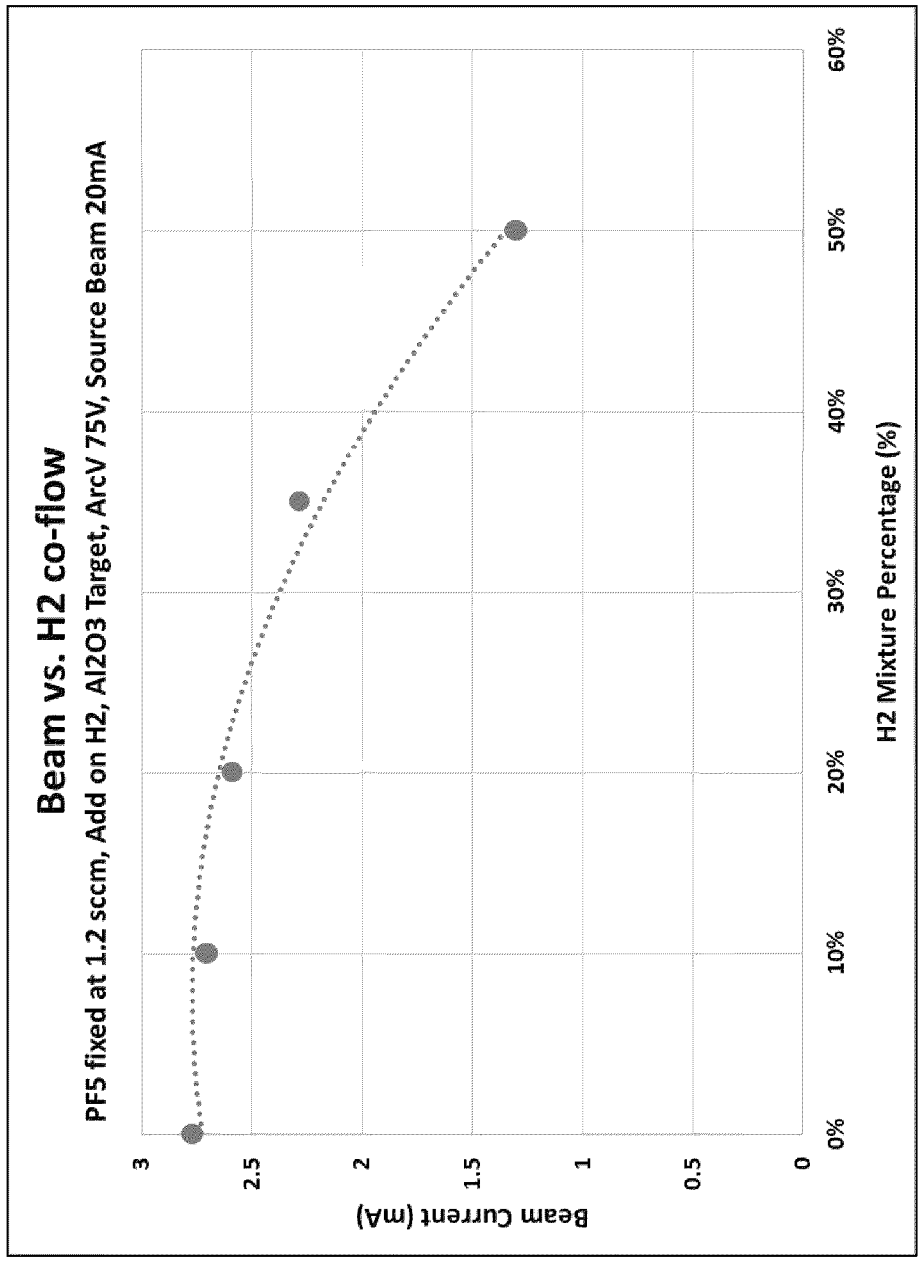
FIG. 9 shows beam current produced by an ion implantation system using an aluminum oxide target, PF$_5$ as a fluorine-containing gas, and H$_2$ as a hydrogen-containing gas over a range of relative amounts.

FIG. 9 shows experimental examples of an $Al^+$ beam current achieved by using solid aluminum oxide as a solid aluminum target, $PF_5$ fluorine-containing co-gas, and varied amounts of hydrogen-containing co-gas ($H_2$). The data was generated by a process that flowed 1.2 standard cubic centimeter per minute (sccm) of $PF_5$ while varying flow of the hydrogen. Arc voltage (ArcV) was 75 volts and the power of the source beam was 20 milliamps (mA).

The results at FIG. 9 indicate that beam current will vary over a range of a relative amount of the hydrogen-containing gas versus total hydrogen-containing gas and fluorine-containing gas. Lower amounts of hydrogen provide a relatively higher beam current, but beam current is relatively consistent for use of the hydrogen-containing gas in a range up to about 30 or 35 percent hydrogen. Also, higher amounts of hydrogen result in reduced levels of certain non-aluminum ions (see FIGS. 10 and 11), which may extend source life.

A maximum beam current occurs at approximately 10 percent hydrogen. To maximize total beam current strength, a method of the invention may be performed by flowing hydrogen to the ion source in an amount of about 10 percent. Alternately, to achieve a desirably high beam current strength balanced by a relatively higher ion source life or a relatively lower amount of tungsten ion in an ion beam, the method may be performed by flowing a different (higher) amount of hydrogen to the ion source, e.g., an amount in a range from 3 to 60 percent, or from 5 to 35, 40, 45, 50, 55 or 60 percent, or from 5 or 10 percent up to 25 or 30 percent.

While the maximum beam current occurs at approximately 10 percent hydrogen, the maximum beam current may be higher or lower for different ion source designs and for different operating parameters (e.g., arc voltage). A useful method, for a different ion source or operating parameters, may adjust the amount of hydrogen-containing gas based on the amount of hydrogen-containing gas that is found to produce the maximum beam current.

Figure 10:
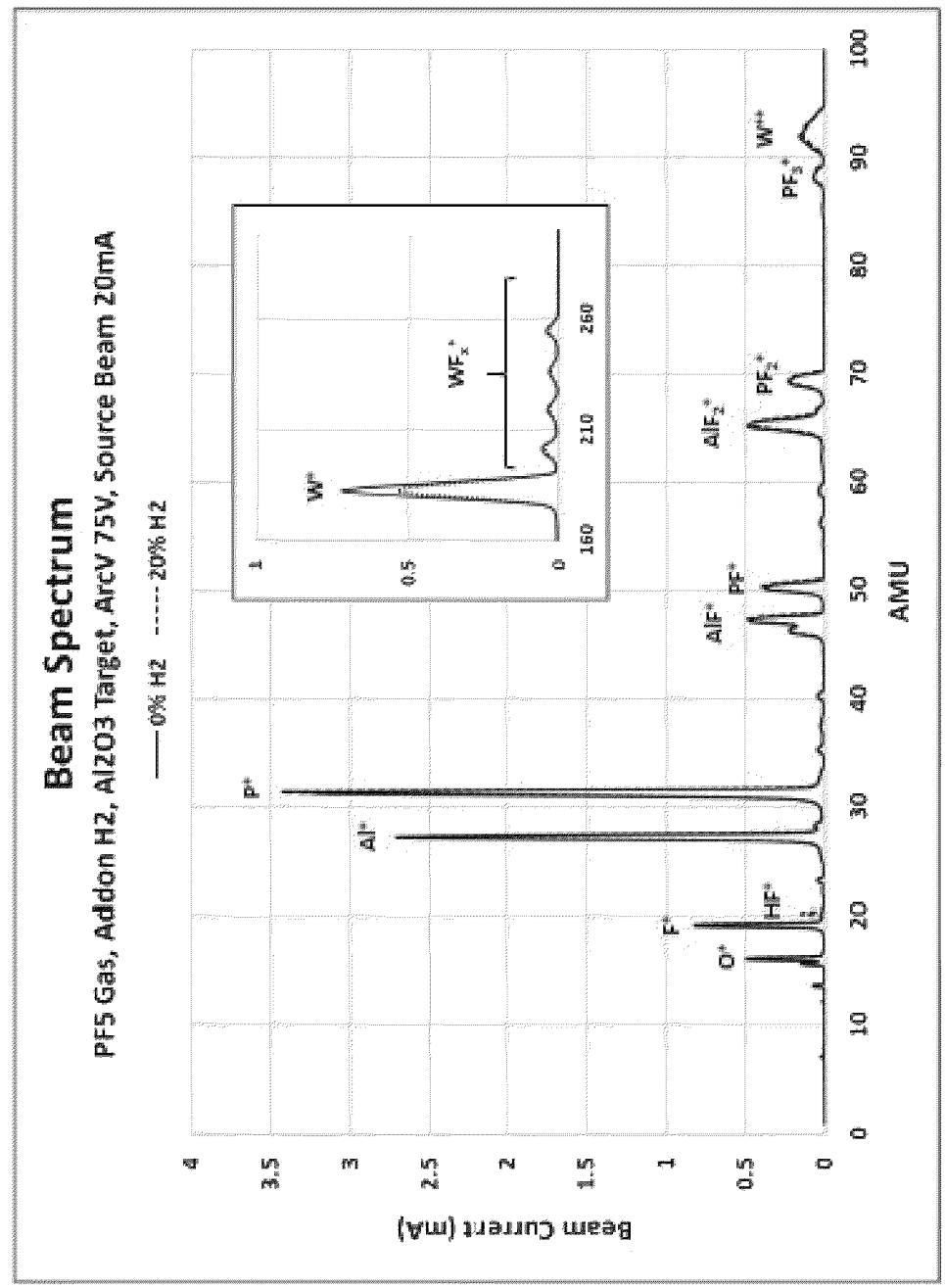
FIGS. 10 and 11 show ions and relative amounts thereof contained in ion beams produced by an ion implantation system using an aluminum oxide target, PF$_5$ as a fluorine-containing gas, and H$_2$ as a hydrogen-containing gas, and using varied amounts of the hydrogen-containing gas.

FIG. 10 shows beam current relative to atomic mass unit (AMU) of aluminum and non-aluminum ions produced according to Example 4.

The results at FIG. 10 indicate that certain beam currents of non-aluminum ion species are reduced by the use of hydrogen-containing co-gas. For example, the beam contains a significantly reduced amount of $W^+$ with a flow of 20 percent hydrogen gas.

Figure 11:
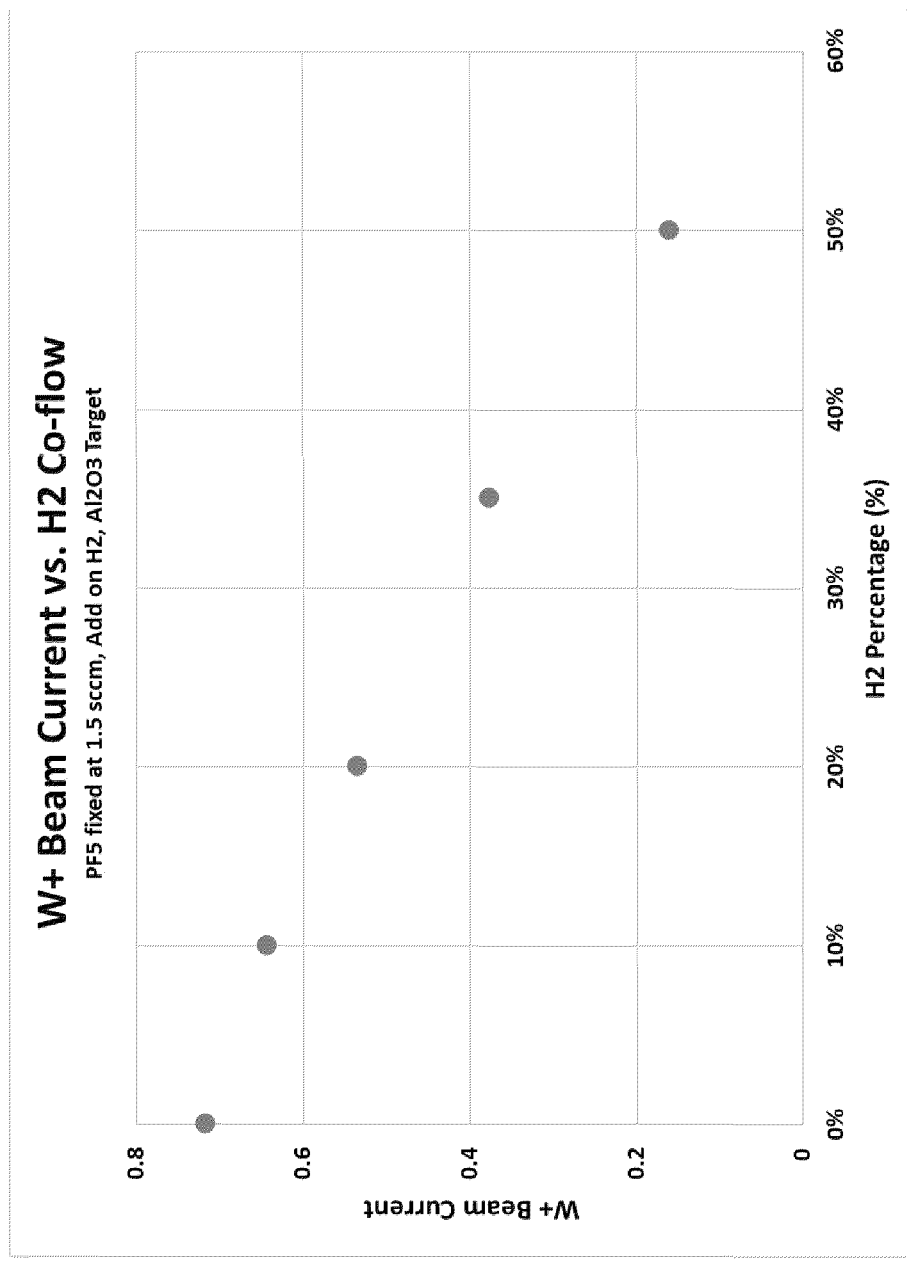

FIG. 11 shows beam current of tungsten ion (We) relative to different amounts of hydrogen (percentage), and indicates that higher levels of hydrogen result in steadily reduced levels of tungsten ion in the ion beam that is produced.

For the system and method of Example 4, a preferred range of hydrogen can be one that results in a desired reduction in tungsten ion (We) in an ion beam, which may be an amount of hydrogen that is at least 5, 10, 20, 30, 40, 50 or 60 percent as shown at FIGS. 10 and 11. Optionally, a specific amount of hydrogen that is used may be balanced with a desired (e.g., optimized) beam current strength as shown at FIG. 9. Example methods to balance a desirably high total beam current (FIG. 9) with a desirably low tungsten ion beam current (FIG. 10, FIG. 11) may be performed by flowing hydrogen (or another hydrogen-containing gas) in an amount in a range from 2 to 60 percent, or from 5 or 10 percent up to 20, 25, 30, 35, 40, 45, 50 or 55 percent.

Within these ranges, the system may perform with a reduced level of glitching produced by a useful level of the hydrogen gas. According to a method of the invention, the amount of hydrogen used may be selected to produce a reduced level of glitching, e.g., a level of glitching that is reduced by at least 20, 50, 70, or 80 percent relative to an amount of glitching that occurs with no hydrogen.

Example 5. (FIG. 12) Aluminum Nitride Precursor with $GeF_4$ Fluorine-Containing Co-Gas and Varied Amounts Hydrogen-Containing Co-Gas ($H_2$)

Figure 12:
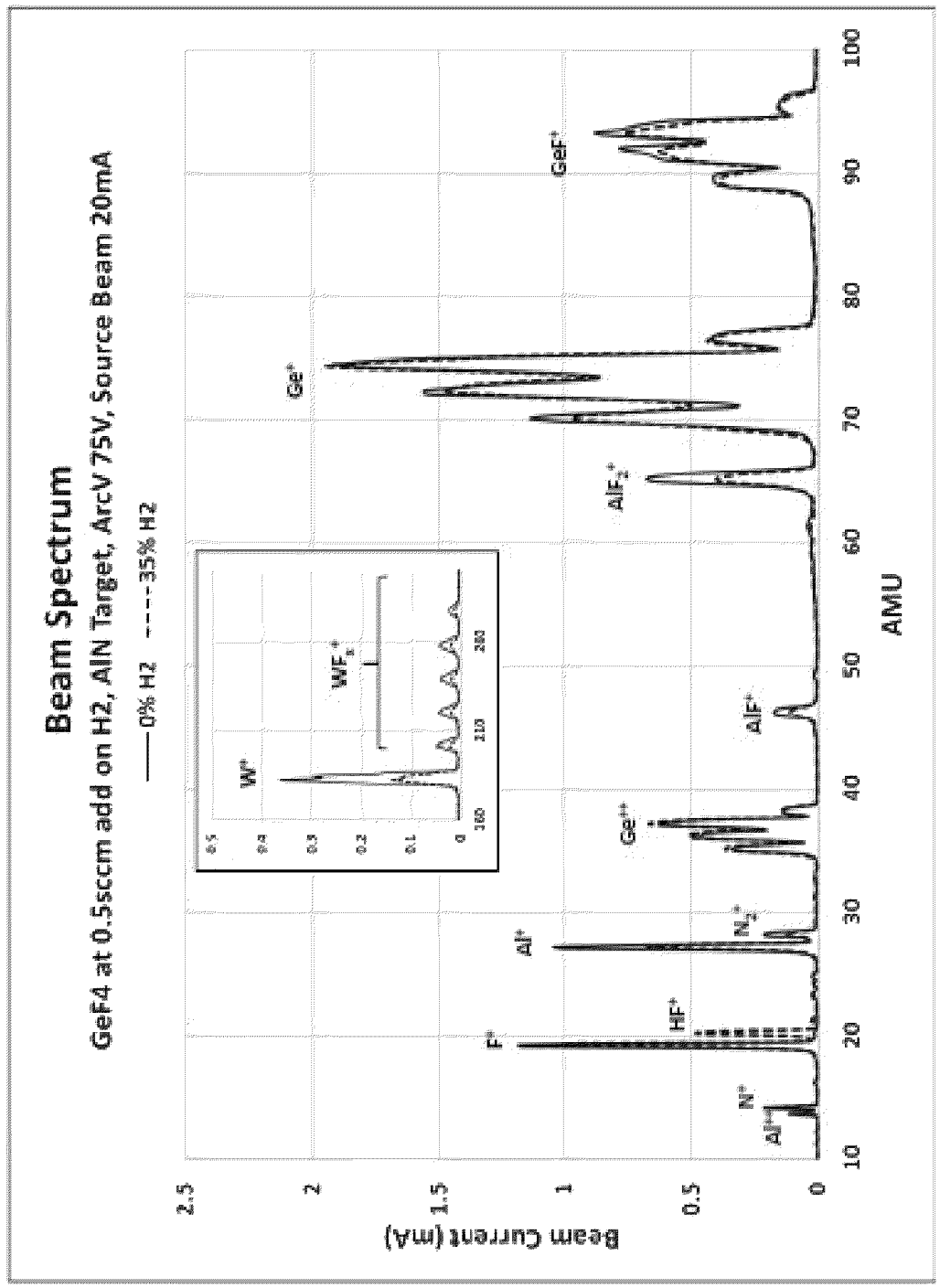
FIGS. 12 and 13 show ionic species and relative amounts thereof contained in ion beams produced by an ion implantation system using an aluminum nitride or aluminum oxide target, GeF$_4$ as a fluorine-containing gas, and H$_2$ as a hydrogen-containing gas, and using varied amounts of the hydrogen-containing gas.

FIG. 12 shows experimental examples of an Al+ beam current achieved by using solid aluminum nitride as a solid aluminum target, $GeF_4$ fluorine-containing co-gas, and varied amounts of hydrogen-containing co-gas ($H_2$). The data was generated by a process that flowed 0.5 standard cubic centimeter per minute (sccm) of $GeF_4$ while varying flow of the hydrogen. Arc voltage (ArcV) was 75 volts and the power of the source beam was 20 milliamps (mA).

The experiment also showed that that beam current will vary over a range of a relative amount of the hydrogen-containing gas versus total hydrogen-containing gas and fluorine-containing gas. Lower amounts of hydrogen provide a relatively higher beam current. However, using higher amounts of hydrogen results in substantially reduced levels of certain non-aluminum ions (see FIG. 12), which may extend source life.

A maximum beam current occurs with no hydrogen flow. To achieve a desirably high beam current strength balanced by a relatively higher ion source life or a relatively lower amount of tungsten ion in an ion beam, the method may be performed by flowing an amount of hydrogen to the ion source that is greater than zero.

While the maximum beam current occurs at zero percent hydrogen, a maximum beam current may occur at a higher (non-zero) amount of hydrogen for a different ion source design and for different operating parameters (e.g., arc voltage). A useful method for a different ion source or operating parameters may adjust the amount of hydrogen-containing gas based on the amount of hydrogen-containing gas that is found to produce the maximum beam current.

FIG. 12 shows beam current relative to atomic mass unit (AMU) of aluminum and non-aluminum ions produced in Example 5.

The results at FIG. 12 indicate that certain beam currents of non-aluminum ion species are reduced by the use of hydrogen-containing co-gas. In specific, the beam contains significantly reduced amounts of $W^+$ and $WF_x^+$ ions, which are ions that can negatively affect ion source performance and source life, e.g., by causing "glitching" or by eroding an arc chamber exit aperture.

A system of Example 5 may perform with a reduced level of glitching produced by a useful level of the hydrogen gas. According to a method of the invention, the amount of hydrogen used may be selected to produce a reduced level of glitching, e.g., a level of glitching that is reduced by at least 20, 50, 70, or 80 percent relative to an amount of glitching that occurs with no hydrogen.

Example 6. (FIG. 13) Aluminum Oxide Precursor with $GeF_4$ Fluorine-Containing Co-Gas and Varied Amounts Hydrogen-Containing Co-Gas ($H_2$)

Figure 13:
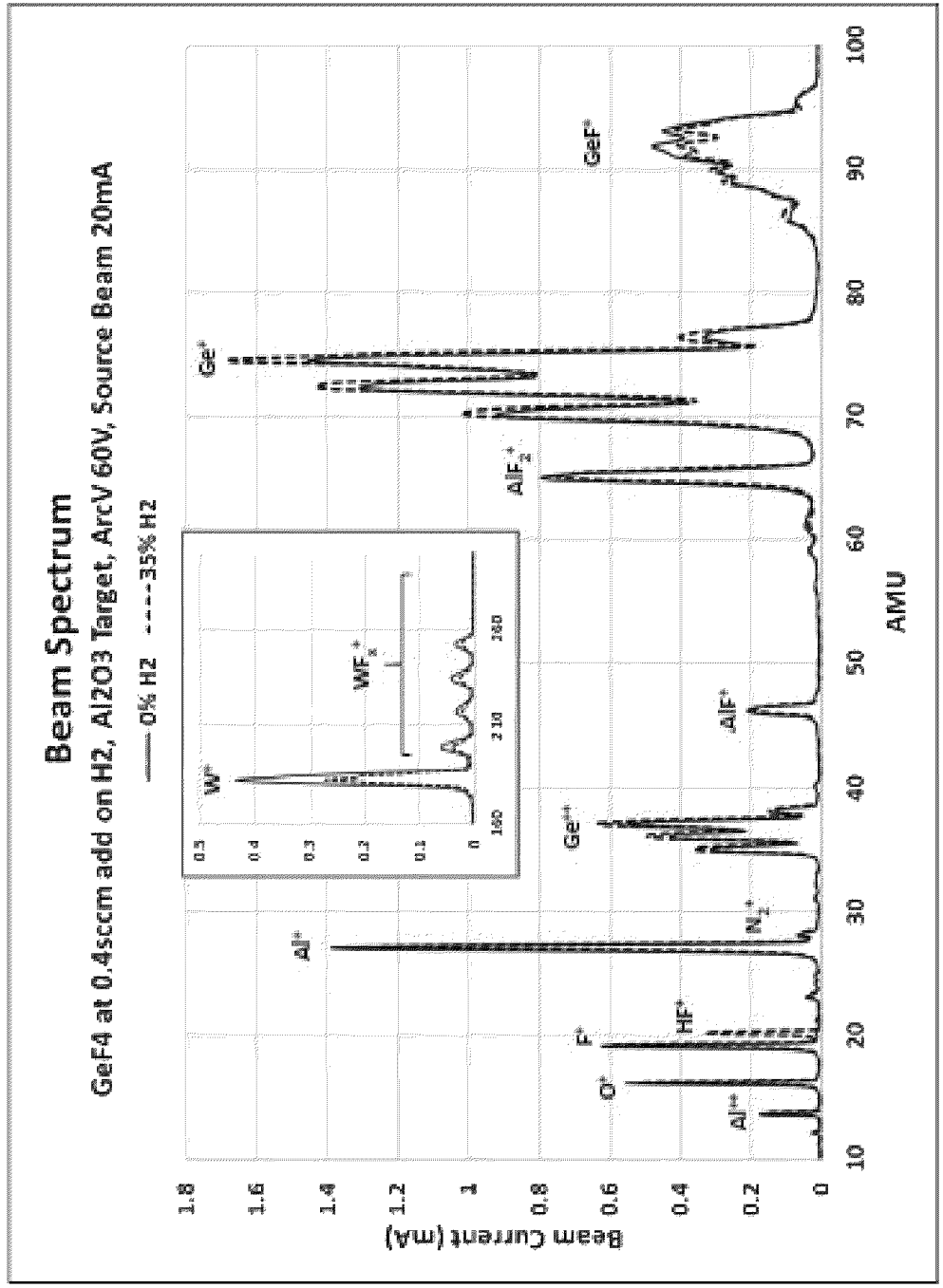

FIG. 13 shows experimental examples of an $Al^+$ beam current achieved by using solid aluminum oxide as a solid aluminum target, $GeF_4$ fluorine-containing co-gas, and varied amounts of hydrogen-containing co-gas ($H_2$). The data was generated by a process that flowed 0.4 standard cubic centimeter per minute (sccm) of $GeF_4$ while varying flow of the hydrogen. Arc voltage (ArcV) was 60 volts and the power of the source beam was 20 milliamps (mA).

The experiment also showed that beam current will vary over a range of a relative amount of the hydrogen-containing gas versus total hydrogen-containing gas and fluorine-containing gas.

Lower amounts of hydrogen provide a relatively higher beam current. Also, using higher amounts of hydrogen results in substantially reduced levels of certain non-aluminum ions (see FIG. 13), which may extend source life.

A maximum beam current occurs with no hydrogen flow. To achieve a desirably high beam current strength balanced by a relatively higher ion source life or a relatively lower amount of tungsten ion in an ion beam, the method may be performed by flowing an amount of hydrogen to the ion source that is greater than zero.

While the maximum beam current occurs at zero percent hydrogen, a maximum beam current may occur at a higher (non-zero) amount of hydrogen for a different ion source design and for different operating parameters (e.g., arc voltage). A useful method for a different ion source or operating parameters may adjust the amount of hydrogen-containing gas based on the amount of hydrogen-containing gas that is found to produce the maximum beam current.

FIG. 13 shows beam current relative to atomic mass unit (AMU) of aluminum and non-aluminum ions produced in Example 6.

The results at FIG. 13 indicate that certain beam currents of non-aluminum ion species are reduced by the use of hydrogen-containing co-gas. In specific, the beam contains significantly reduced amounts of $W^+$ and $WF_x^+$ ions, which are ions that can negatively affect ion source performance and source life, e.g., by causing "glitching" or by eroding an arc chamber exit aperture.

A system of Example 6 may perform with a reduced level of glitching produced by a useful level of the hydrogen gas. According to a method of the invention, the amount of hydrogen used may be selected to produce a reduced level of glitching, e.g., a level of glitching that is reduced by at least 20, 50, 70, or 80 percent relative to an amount of glitching that occurs with no hydrogen.

Example 7. (FIGS. 14, 15, and 16) Aluminum Oxide Precursor with $PF_3$ Fluorine-Containing Co-Gas and Varied Amounts Hydrogen-Containing Co-Gas ($H_2$)

Figure 14:
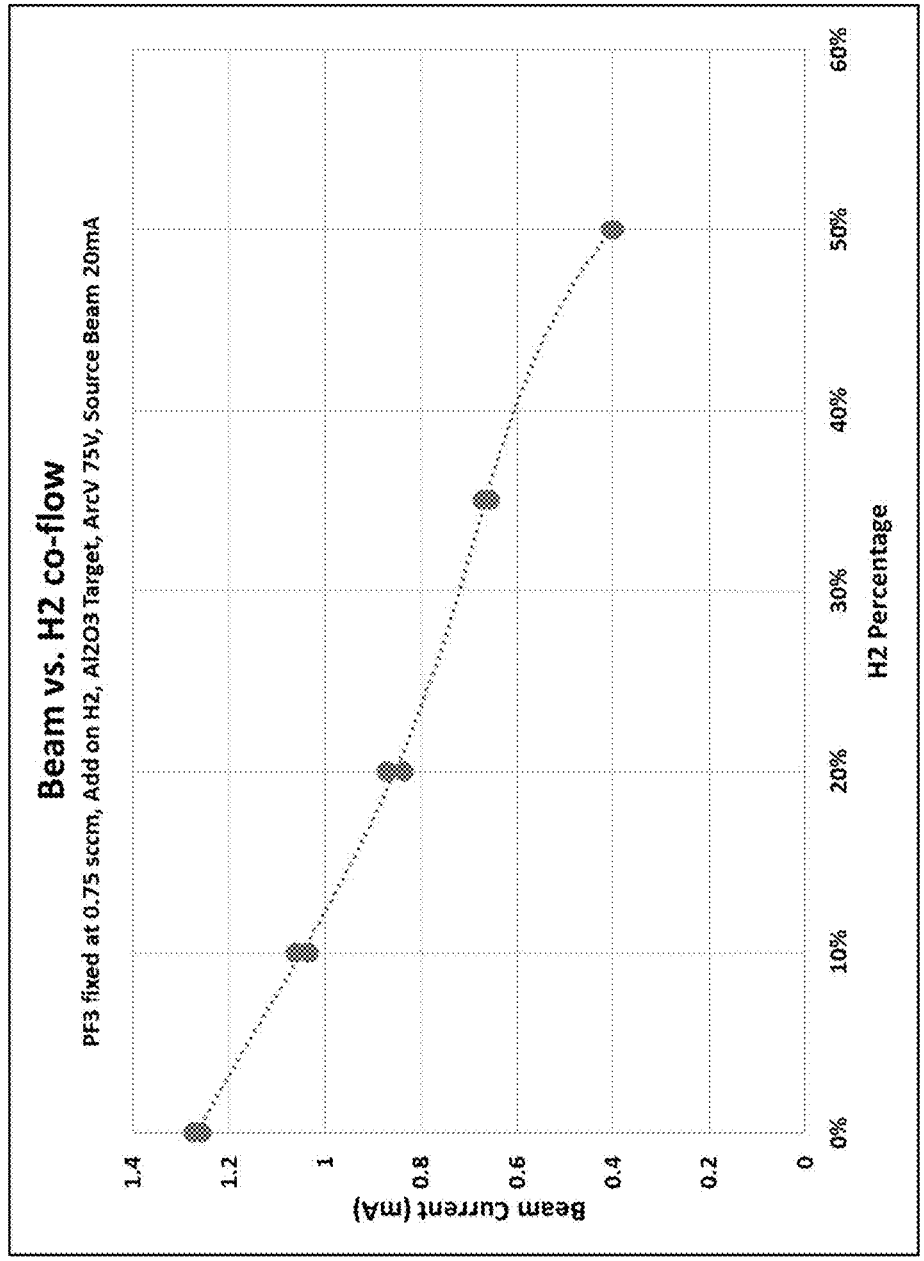
FIG. 14 shows beam current produced by an ion implantation system using an aluminum oxide target, PF$_3$ as a fluorine-containing gas, and H$_2$ as a hydrogen-containing gas over a range of relative amounts.

FIG. 14 shows experimental examples of an $Al^+$ beam current achieved by using solid aluminum oxide as a solid aluminum target, $PF_3$ fluorine-containing co-gas, and varied amounts of hydrogen-containing co-gas ($H_2$). The data was generated by a process that flowed 0.75 standard cubic centimeter per minute (sccm) of $PF_3$ while varying flow of the hydrogen. Arc voltage (ArcV) was 75 volts and the power of the source beam was 20 milliamps (mA).

The results at FIG. 14 indicate that beam current will vary over a range of a relative amount of the hydrogen-containing gas versus total hydrogen-containing gas and fluorine-containing gas. Lower amounts of hydrogen provide a relatively higher beam current. However, using higher amounts of hydrogen results in substantially reduced levels of certain non-aluminum ions (see FIGS. 15 and 16), which may extend source life.

A maximum beam current occurs with no hydrogen flow. To achieve a desirably high beam current strength balanced by a relatively higher ion source life or a relatively lower amount of tungsten ion in an ion beam, the method may be performed by flowing an amount of hydrogen to the ion source that is greater than zero, e.g., an amount in a range from 1, 2, or 3 up to 45, 50, 55 or 60 percent, or from to 35, 40 or 45 percent, or from 10 percent up to 25, 30, 35 or 40 percent.

While the maximum beam current occurs at zero percent hydrogen, a maximum beam current may occur at a higher (non-zero) amount of hydrogen for a different ion source design and for different operating parameters (e.g., arc voltage). A useful method for a different ion source or operating parameters may adjust the amount of hydrogen-containing gas based on the amount of hydrogen-containing gas that is found to produce the maximum beam current.

Figure 15:
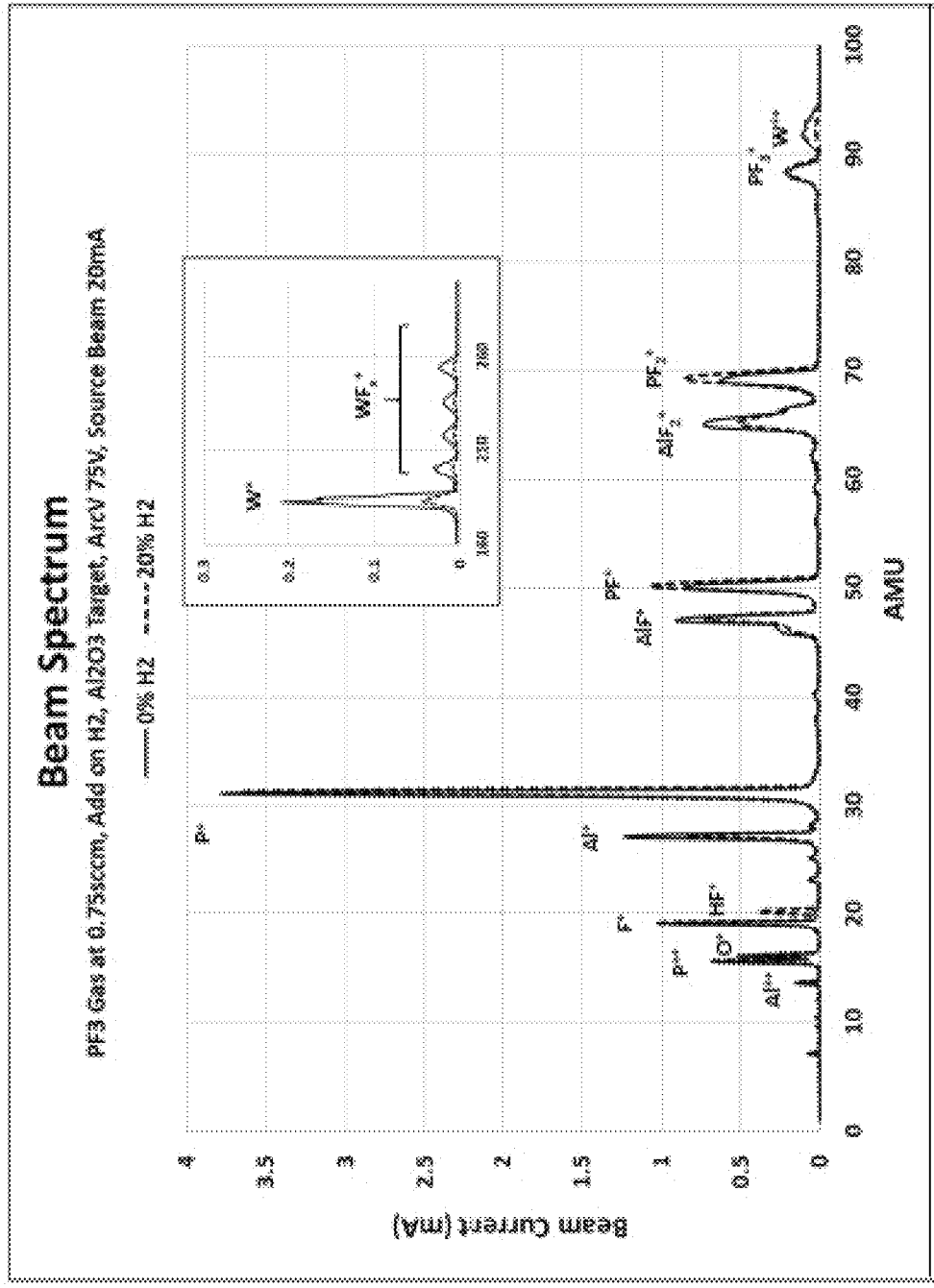
FIGS. 15 and 16 show ionic species and relative amounts thereof contained in ion beams produced by an ion implantation system using an aluminum oxide target, PF$_3$ as a fluorine-containing gas, and H$_2$ as a hydrogen-containing gas, and using varied amounts of the hydrogen-containing gas.

FIG. 15 shows beam current relative to atomic mass unit (AMU) of aluminum and non-aluminum ions produced in Example 7.

The results at FIG. 15 indicate that certain beam currents of non-aluminum ion species are reduced by the use of hydrogen-containing co-gas. In specific, the beam contains significantly reduced amounts of $W^{++}$, $W^+$, and $WF_x^+$ ions, which are ions that can negatively affect ion source performance and source life, e.g., by causing "glitching" or by eroding an arc chamber exit aperture.

Figure 16:
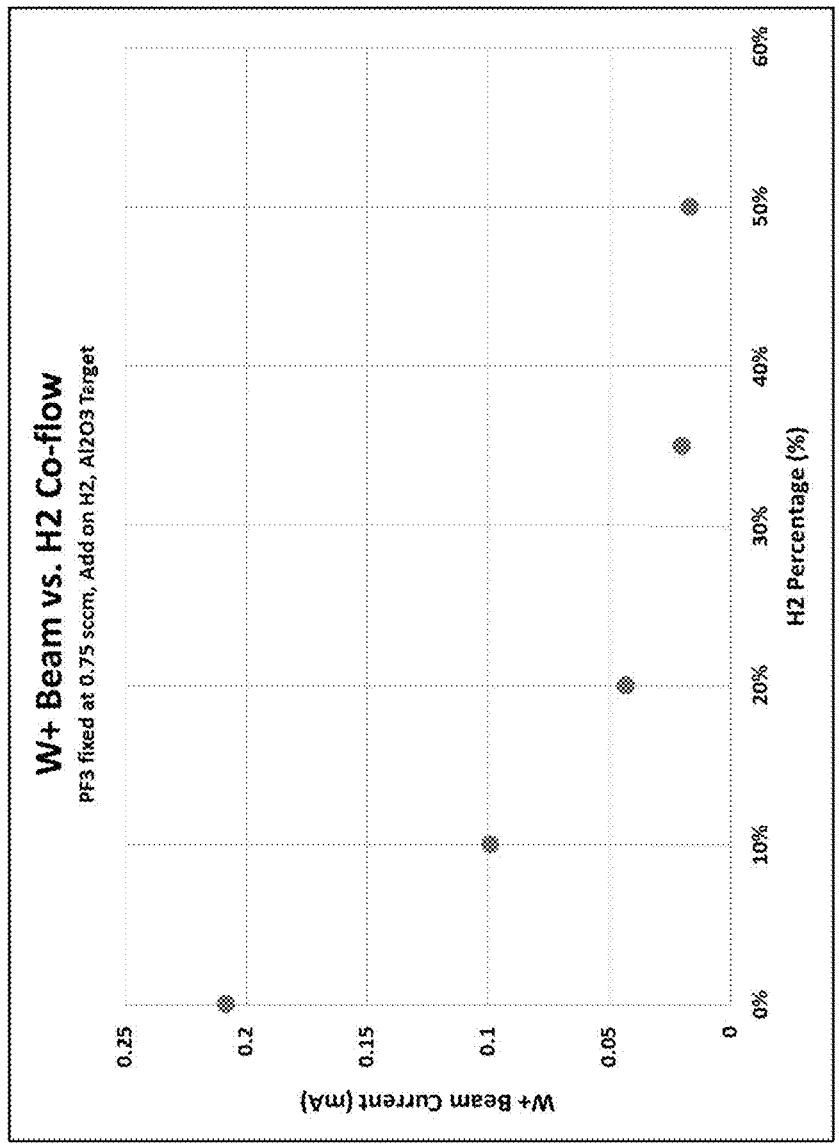

FIG. 16 shows beam current of tungsten ion ($W^+$) relative to different amounts of hydrogen (percentage), and indicates that higher levels of hydrogen result in reduced levels of tungsten ion in the ion beam that is produced.

Figure 18:
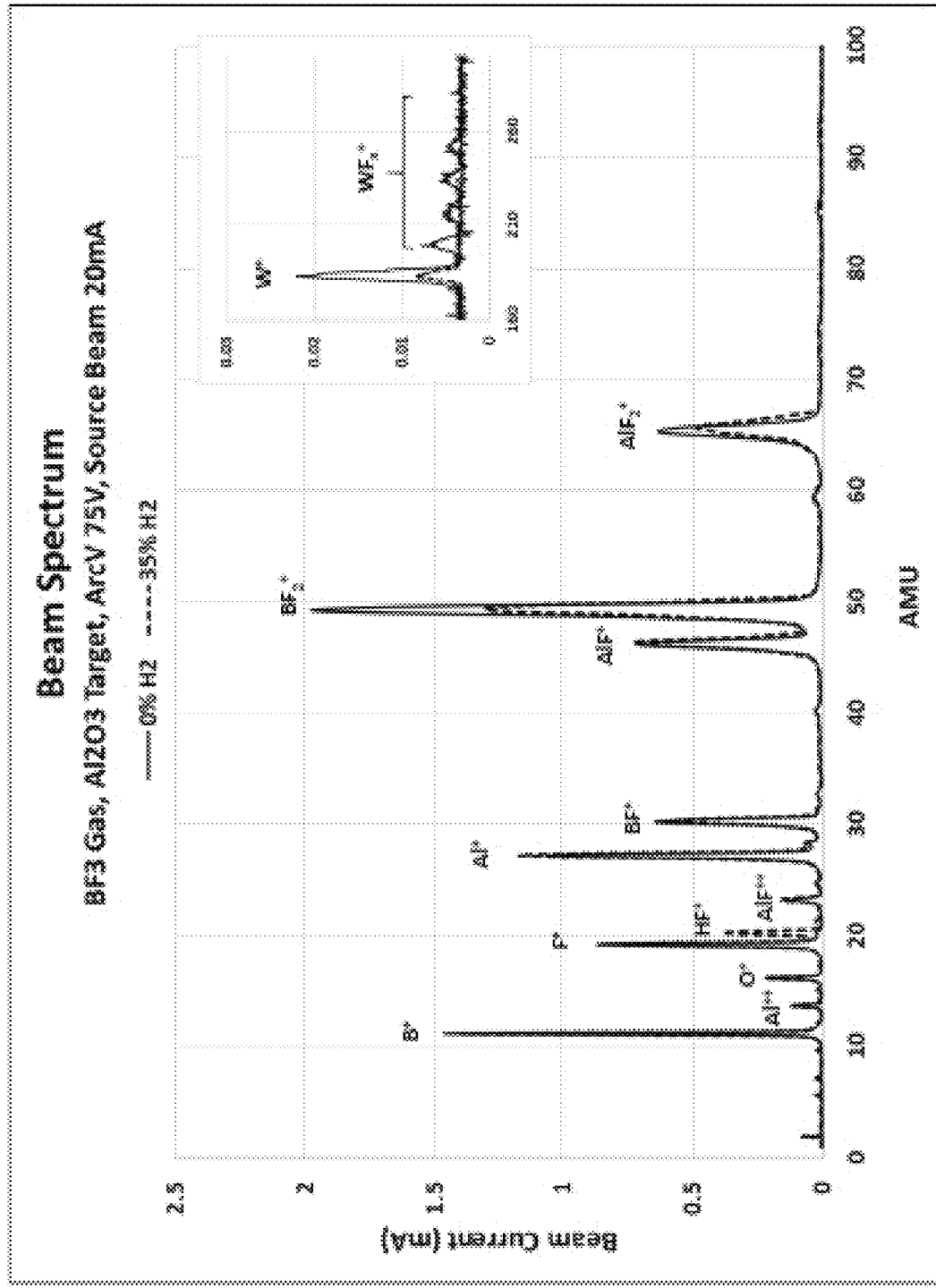
FIGS. 18 and 19 show ionic species and relative amounts thereof contained in ion beams produced by an ion implantation system using an aluminum oxide target, BF$_3$ as a fluorine-containing gas, and H$_2$ as a hydrogen-containing gas, and using varied amounts of the hydrogen-containing gas.
Figure 19:
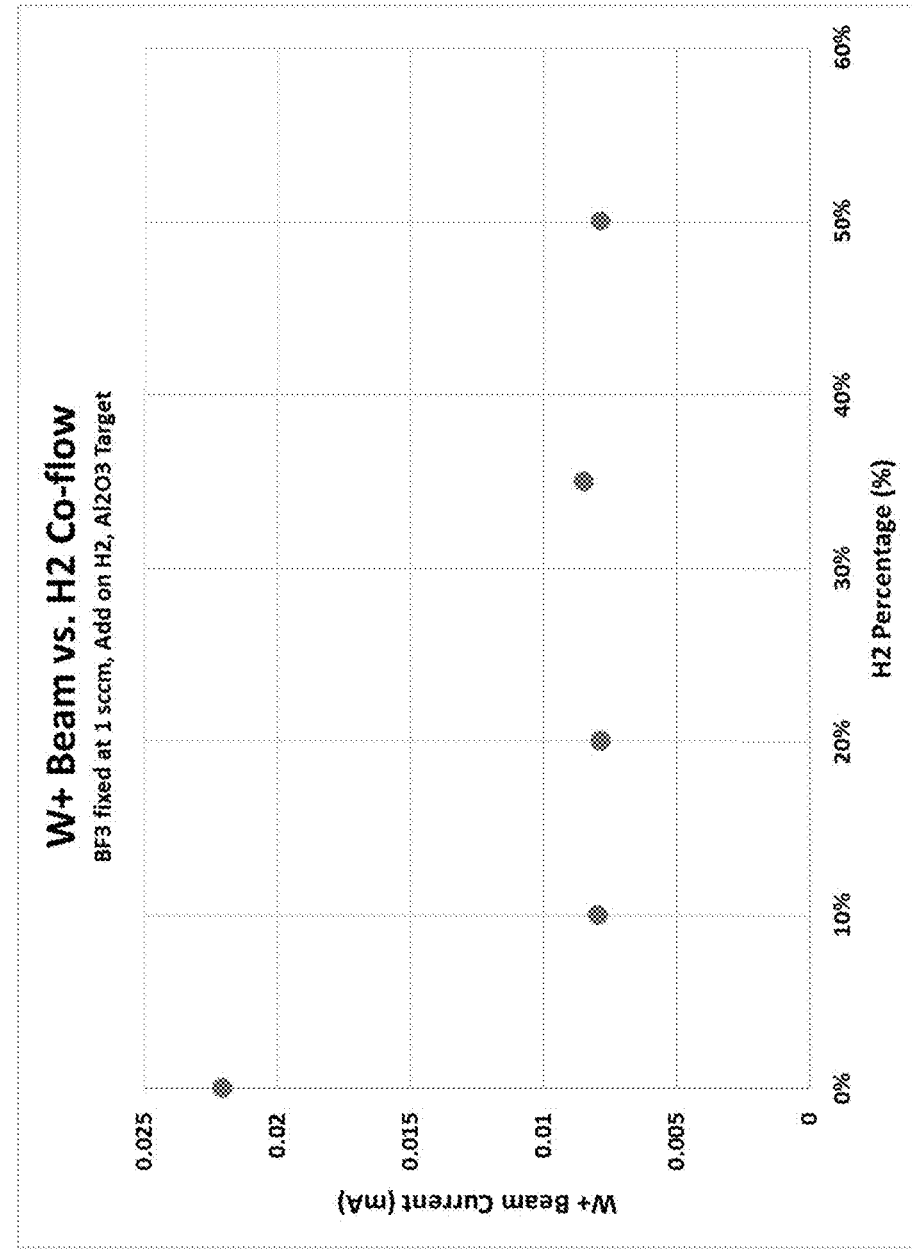
Figure 20:
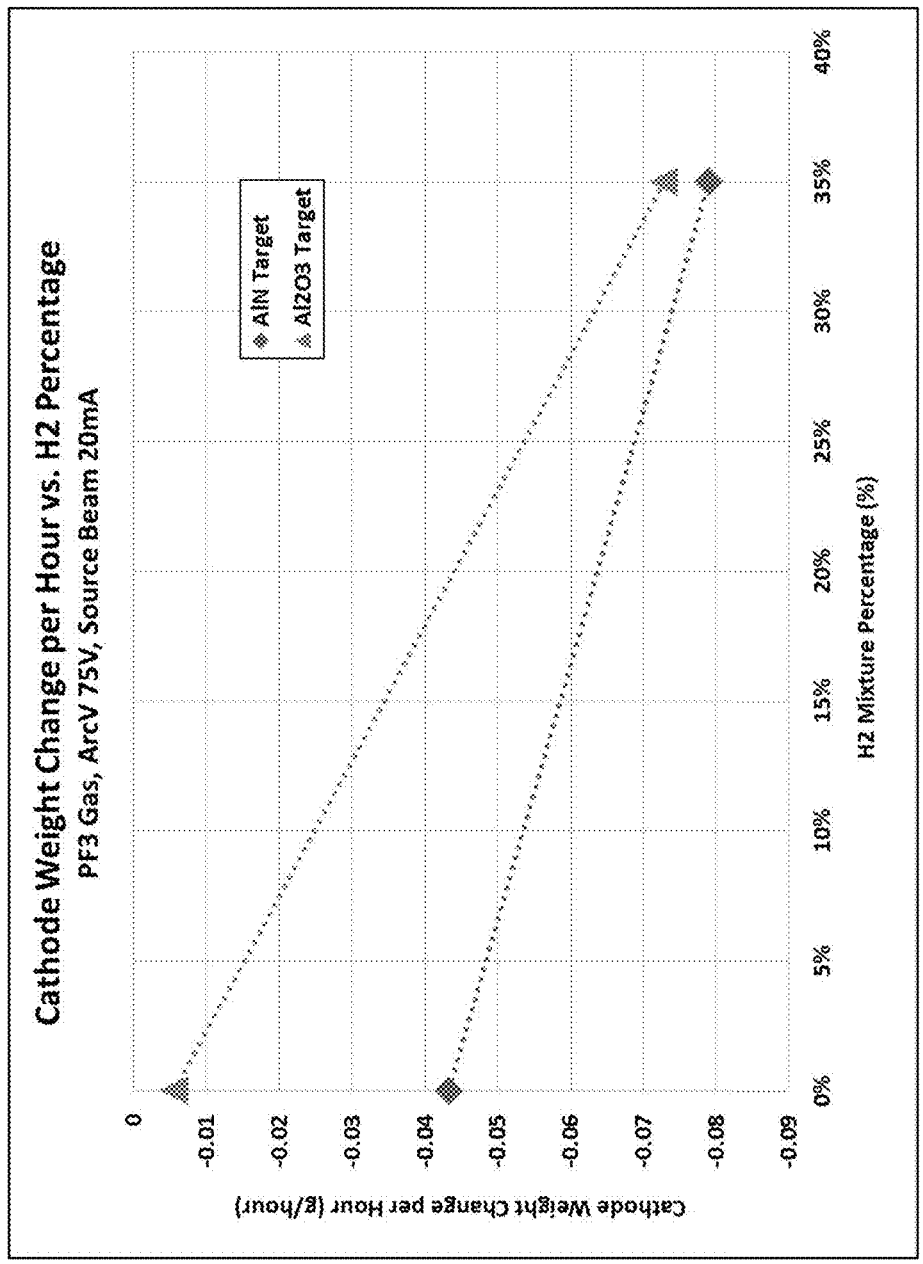
FIG. 20 shows cathode weight change per hour that occurred in an ion implantation system using an aluminum oxide target or aluminum nitride target, PF$_3$ as a fluorine-containing gas, and H$_2$ as a hydrogen-containing gas over a range of relative amounts.

For the system and method of Example 7, a preferred range of hydrogen can be one that results in a desired reduction in tungsten ion ($W^+$) in an ion beam, which may be an amount of hydrogen that is at least 3, 5, 10, 20, 30, 40, 50 or 60 percent as shown at FIGS. 19 and 20. A specific amount of hydrogen that is used may be balanced with a desired beam current strength as shown at FIG. 18. Example methods to balance a desirably high total beam current (FIG. 14) with a desirably low tungsten ion beam current (FIG. 15, FIG. 16) may be performed by flowing hydrogen (or another hydrogen-containing gas) in an amount in a range from 2 to 60 percent, or from 3 or 5 percent up to 20, 25, 30, 35, 40, 45, 50 or 55 percent.

Within these ranges, the system may perform with a reduced level of glitching produced by a useful level of the hydrogen gas. According to a method of the invention, the amount of hydrogen used may be selected to produce a reduced level of glitching, e.g., a level of glitching that is reduced by at least 20, 50, 70, or 80 percent relative to an amount of glitching that occurs with no hydrogen.

Example 8. (FIGS. 17, 18, and 19) Aluminum Oxide Precursor with $BF_3$ Fluorine-Containing Co-Gas and Varied Amounts Hydrogen-Containing Co-Gas ($H_2$)

Figure 17:
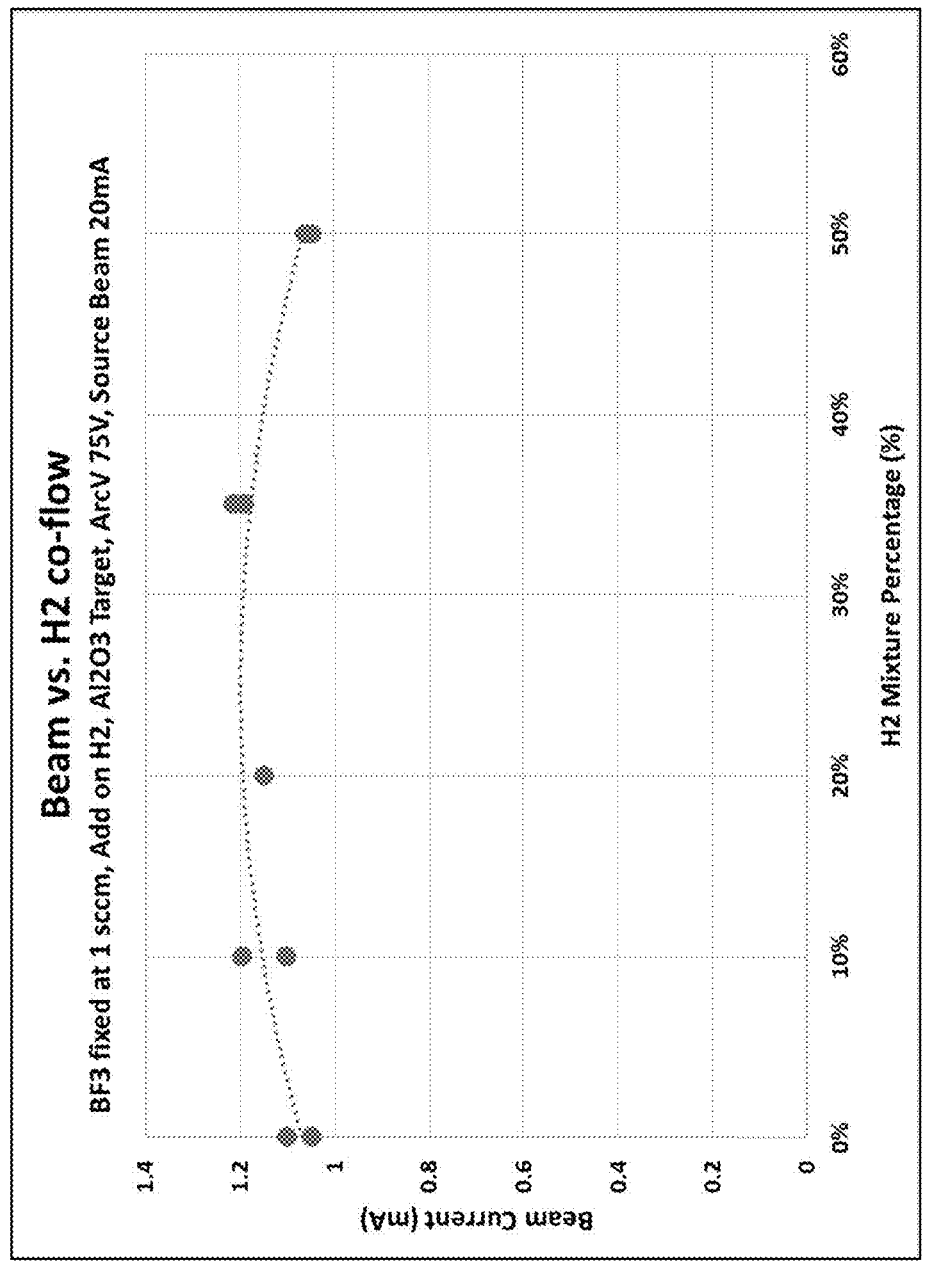
FIG. 17 shows beam current produced by an ion implantation system using an aluminum oxide target, BF$_3$ as a fluorine-containing gas, and H$_2$ as a hydrogen-containing gas over a range of relative amounts.

FIG. 17 shows experimental examples of an Al+ beam current achieved by using solid aluminum oxide as a solid aluminum target, $BF_3$ fluorine-containing co-gas, and varied amounts of hydrogen-containing co-gas ($H_2$). The data was generated by a process that flowed 1 standard cubic centimeter per minute (sccm) of $BF_3$ while varying flow of the hydrogen. Arc voltage (ArcV) was 75 volts and the power of the source beam was 20 milliamps (mA).

The results at FIG. 17 indicate that beam current is relatively stable over a range of a relative amount of the hydrogen-containing gas versus total hydrogen-containing gas and fluorine-containing gas. A maximum beam current occurs at approximately 25 percent hydrogen. To maximize total beam current strength, a method of the invention may be performed by flowing hydrogen to the ion source in an amount of about 25 percent. Alternately, to achieve a desirably high beam current strength balanced by a relatively higher ion source life or a relatively lower amount of tungsten ion in an ion beam, the method may be performed by flowing a different (higher) amount of hydrogen to the ion source, e.g., an amount in a range from 5 to 40 percent, or 20 to 30 percent, or from 25 or 35 percent. But, due to the consistent range of beam current relative to hydrogen gas, any level of hydrogen may be useful, between zero and 60 percent.

FIG. 18 shows beam current relative to atomic mass unit (AMU) of aluminum and non-aluminum ions produced with Example 8.

The results at FIG. 18 indicate that certain beam currents of non-aluminum ion species are reduced by the use of hydrogen-containing co-gas. In specific, the beam contains significantly reduced amounts of $W^+$ and $WF_x^+$ ions, which are ions that can negatively affect ion source performance and source life, e.g., by causing "glitching" or by eroding an arc chamber exit aperture. Also, the use of the hydrogen as a co-flow gas did not cause a significant reduction in the level of $Al^+$ in the ion beam.

FIG. 19 shows beam current of tungsten ion ($W^+$) relative to different amounts of hydrogen (percentage), and indicates that higher levels of hydrogen result in reduced levels of tungsten ion in the ion beam that is produced.

For the system and method of Example 8, a preferred range of hydrogen can be one that results in a desired reduction in tungsten ion ($W^+$) in an ion beam, which may be an amount of hydrogen that is at least 3, 5, 10, or 15 percent as shown at FIGS. 18 and 19. A specific amount of hydrogen that is used may be balanced with a desired beam current strength as shown at FIG. 17. Example methods to balance a desirably high total beam current (FIG. 17) with a desirably low tungsten ion beam current (FIG. 18, FIG. 19) may be performed by flowing hydrogen (or another hydrogen-containing gas) in an amount in a range from 2 to 60 percent, or from 3 or 5 percent up to 30, 35, 40 or 45 percent.

Within these ranges, the system may perform with a reduced level of glitching produced by a useful level of the hydrogen gas. According to a method of the invention, the amount of hydrogen used may be selected to produce a reduced level of glitching, e.g., a level of glitching that is reduced by at least 20, 50, 70, or 80 percent relative to an amount of glitching that occurs with no hydrogen.

Example 9. (FIG. 20) Aluminum Oxide or Aluminum Nitride Precursor with $PF_3$ Fluorine-Containing Co-Gas and Varied Amounts Hydrogen-Containing Co-Gas ($H_2$)

FIG. 20 shows experimental examples of an $Al^+$ beam current achieved by using solid aluminum oxide or aluminum nitride as a solid aluminum target, $PF_3$ fluorine-containing co-gas, and varied amounts of hydrogen-containing co-gas.

The results at FIG. 20 indicate that cathode weight change is reduced in the presence of an amount of hydrogen-containing co-gas. A cathode weight change during operation of an ion source can indicate the level of tungsten deposition on cathode.

The invention claimed is:

1. A method of generating aluminum ion in an ion source having an ion source chamber, the method comprising:
in an ion source chamber that contains aluminum dopant source, flowing into the ion source chamber:
fluorine-containing gas selected from $BF_3$, $PF_3$, $PF_5$, $GeF_4$, $XeF_2$, $CF_4B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$ (n=1, 2, 3 . . . , -x=0, 1, 2 . . . ), $COF_2$, $SF_6$, $SF_4$, $SeF_6$, $NF_3$, $N_2F_4$, HF, $F_2$, or a combination thereof, and
hydrogen-containing gas, wherein flowing the hydrogen containing gas to the ion source in an amount that is 10 to 30 percent to a maximum beam current, and
generating aluminum ions within the ion source chamber;
wherein the aluminum dopant source comprises solid aluminum target selected from: aluminum oxide, aluminum carbide, aluminum boride, and a combination of these.

2. The method of claim 1 wherein hydrogen-containing gas and fluorine-containing gas are flowed into the ion source chamber in relative amounts of from 2 to 60 percent (volume) hydrogen-containing gas based on total hydrogen-containing and fluorine-containing gas.

3. The method of claim 1 wherein hydrogen-containing gas and fluorine-containing gas are flowed into the ion source chamber in relative amounts of from 5 to 60 percent (volume) hydrogen-containing gas based on total hydrogen-containing and fluorine-containing gas.

4. The method of claim 1 wherein the flow of hydrogen-containing gas to the ion source as a co-gas extends an operating life of the ion source by at least 10 percent relative to an operating life that would result from comparable operation of the ion source without the hydrogen-containing gas.

5. The method of claim 1 wherein the flow of hydrogen-containing gas to the ion source as a co-gas reduces glitching of the ion source by at least 20 percent relative to an amount of glitching that would result from comparable operation of the ion source without the hydrogen-containing gas.

6. The method of claim 1 comprising generating neutral or ionized fluorine-containing species from the fluorine-containing gas, and reacting the fluorine-containing species with the aluminum target to generate aluminum ion.

7. The method of claim 1 wherein the ion source chamber comprises:
an interior defined by interior surfaces that include sidewalls, a bottom, and a top, and
a cathode and an anti-cathode at the interior,
wherein an interior surface comprises tungsten or molybdenum.

8. The method of claim 7 wherein:
during generating the aluminum ions, non-aluminum ions are also generated, the non-aluminum ions comprising tungsten ion ($W^+$) or molybdenum ($Mo^+$), tungsten or molybdenum fluoride ion ($WF_x^+$, $MoF_x^+$) (x=1, 2, 3, 4, or 5), or both, and the hydrogen-containing gas reduces an amount of the tungsten ion ($W^+$) or molybdenum (Mo+), tungsten or molybdenum fluoride ion ($WF_x^+$, $MoF_x^+$), or both, that are generated.

9. The method of claim 1 wherein:
the fluorine-containing gas is $PF_3$, $PF_5$, or $GeF_4$, and
the hydrogen-containing gas is $H_2$.

10. The method of claim 1 wherein:
the fluorine-containing gas is $PF_5$, and
the hydrogen-containing gas is $H_2$.

11. The method of claim 1 wherein the hydrogen-containing gas is selected from $H_2$, $PH_3$, $AsH_3$, $SiH_4$, $B_2H_6$, $CH_4$, $NH_3$, $GeH_4$, or $A_xH_y$ (A is any element except H, x, y=1, 2, 3, 4, 5, 6, 7, 8, 8 or 10) and a combination thereof.

12. A method of forming aluminum ion in an ion source chamber, the method comprising:
flowing fluorine-containing gas selected from $PF_3$ and $PF_5$ into an ion source chamber that contains aluminum dopant source, and
flowing a hydrogen-containing gas, wherein flowing the hydrogen containing gas to the ion source in an amount that is 10 to 30 percent to a maximum beam current generating aluminum ion within the ion source chamber;
wherein the aluminum dopant source comprises solid aluminum target selected from: aluminum oxide, aluminum carbide, aluminum boride, and a combination thereof.

13. The method of claim 12 comprising flowing hydrogen-containing gas into the ion source chamber.

14. The method of claim 13 wherein the hydrogen-containing gas is selected from: $H_2$, $PH_3$, $AsH_3$, $SiH_4$, $B_2H_6$, $CH_4$, $NH_3$, $GeH_4$, $A_xH_y$ (A is any element except H, x, y=1, 2, 3, 4, 5, 6, 7, 8, 8 or 10), and a combination thereof.

15. The method of claim 13 comprising flowing $PF_5$ and the hydrogen-containing gas into the ion source chamber in relative amounts of from 2 to 60 percent (volume) hydrogen-containing gas based on total hydrogen-containing gas and fluorine-containing gas.

16. The method of claim 13 comprising flowing $PF_3$ and the hydrogen-containing gas into the ion source chamber in relative amounts of from 2 to 60 percent (volume) hydrogen-containing gas based on total hydrogen-containing gas and fluorine-containing gas.

17. The method of claim 12 comprising: generating neutral or ionized fluorine-containing species from the fluorine-containing gas, and reacting the fluorine-containing species with the aluminum dopant source to generate aluminum ion.

* * * * *